(12) United States Patent
Taguchi et al.

(10) Patent No.: US 10,359,733 B2
(45) Date of Patent: Jul. 23, 2019

(54) SUPPORT MEMBER CONNECTION MECHANISM AND ELECTRICAL APPARATUS INCLUDING THE SAME

(71) Applicant: Sharp Kabushiki Kaisha, Osaka (JP)

(72) Inventors: Noriaki Taguchi, Osaka (JP); Masafumi Sakamoto, Osaka (JP); Shinichi Takeda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 15/286,615

(22) Filed: Oct. 6, 2016

(65) Prior Publication Data
US 2017/0105302 A1   Apr. 13, 2017

(30) Foreign Application Priority Data

Oct. 9, 2015  (JP) ................................. 2015-201042
Sep. 6, 2016  (JP) ................................. 2016-173565

(51) Int. Cl.
| H05K 5/00 | (2006.01) |
| G03G 21/16 | (2006.01) |
| B41J 29/02 | (2006.01) |
| H05K 5/02 | (2006.01) |
| B41J 29/393 | (2006.01) |

(52) U.S. Cl.
CPC .......... *G03G 21/1619* (2013.01); *B41J 29/02* (2013.01); *B41J 29/393* (2013.01); *G03G 21/1633* (2013.01); *G03G 21/1647* (2013.01); *G03G 21/1652* (2013.01); *H05K 5/0217* (2013.01)

(58) Field of Classification Search
CPC ........ H05K 5/0217; B41J 29/02; F16L 3/015; G03G 21/1619
See application file for complete search history.

(56) References Cited

U.S. PATENT DOCUMENTS

| 6,070,742 | A | * | 6/2000 | McAnally | ............ | H05K 7/1491 |
| | | | | | | 211/26 |
| 6,326,547 | B1 | * | 12/2001 | Saxby | .................... | H02G 11/00 |
| | | | | | | 174/69 |
| 6,435,354 | B1 | * | 8/2002 | Gray | .................... | H05K 7/1491 |
| | | | | | | 211/26 |
| 6,902,069 | B2 | * | 6/2005 | Hartman | .............. | H02G 3/0456 |
| | | | | | | 211/26 |

(Continued)

FOREIGN PATENT DOCUMENTS

| JP | 2000-502557 A | 2/2000 |
| WO | WO 97/22826 A1 | 6/1997 |

*Primary Examiner* — Hoa C Nguyen
*Assistant Examiner* — Keith DePew
(74) *Attorney, Agent, or Firm* — Renner, Otto, Boisselle & Sklar, LLP

(57) ABSTRACT

A support member connection mechanism includes a plurality of support members that are arranged side by side in a longitudinal direction of a wiring member and are configured to support the wiring member; and a junction configured to couple between two adjacent support members of the plurality of support members in such a manner that the two adjacent support members are bendable to one side about a rotation axis. The wiring member is exposed in a predetermined bent side junction area including an area of the junction on a bent side of the two adjacent support members.

13 Claims, 24 Drawing Sheets

(56) References Cited

U.S. PATENT DOCUMENTS

| | | | | |
|---|---|---|---|---|
| 7,022,916 B1* | 4/2006 | Cavanaugh | ........... | H05K 7/1491 |
| | | | | 174/100 |
| 7,189,924 B1* | 3/2007 | Popescu | ............... | H05K 7/1491 |
| | | | | 174/69 |
| 8,186,634 B2* | 5/2012 | Chen | .................... | H02G 3/0456 |
| | | | | 248/298.1 |
| 8,379,410 B2* | 2/2013 | Kitten | ................... | H05K 7/1491 |
| | | | | 174/69 |
| 8,387,933 B2* | 3/2013 | Yu | ........................ | H05K 7/1491 |
| | | | | 211/26 |
| 9,370,121 B2* | 6/2016 | Chen | .................... | H05K 7/1491 |
| 2004/0000422 A1* | 1/2004 | Tsutsumi | ............... | H02G 11/00 |
| | | | | 174/135 |
| 2005/0145582 A1* | 7/2005 | Dubon | .................. | H02G 3/128 |
| | | | | 211/26 |
| 2009/0014601 A1* | 1/2009 | Chen | .................... | H02G 3/0456 |
| | | | | 248/70 |
| 2011/0030330 A1* | 2/2011 | Komiya | ................. | F16G 13/16 |
| | | | | 59/78.1 |
| 2013/0161453 A1* | 6/2013 | Hsieh | .................. | H02G 3/0475 |
| | | | | 248/73 |

\* cited by examiner

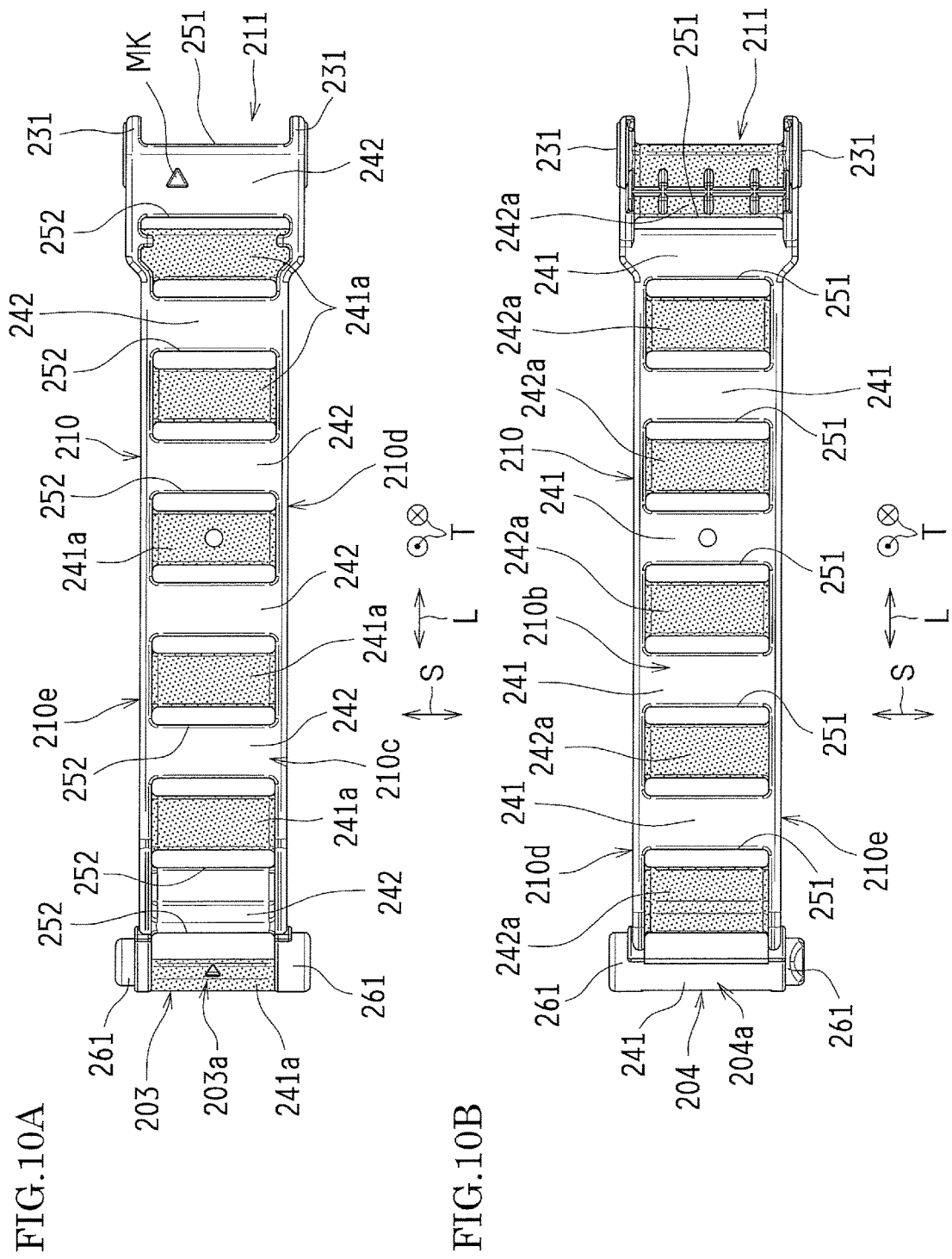

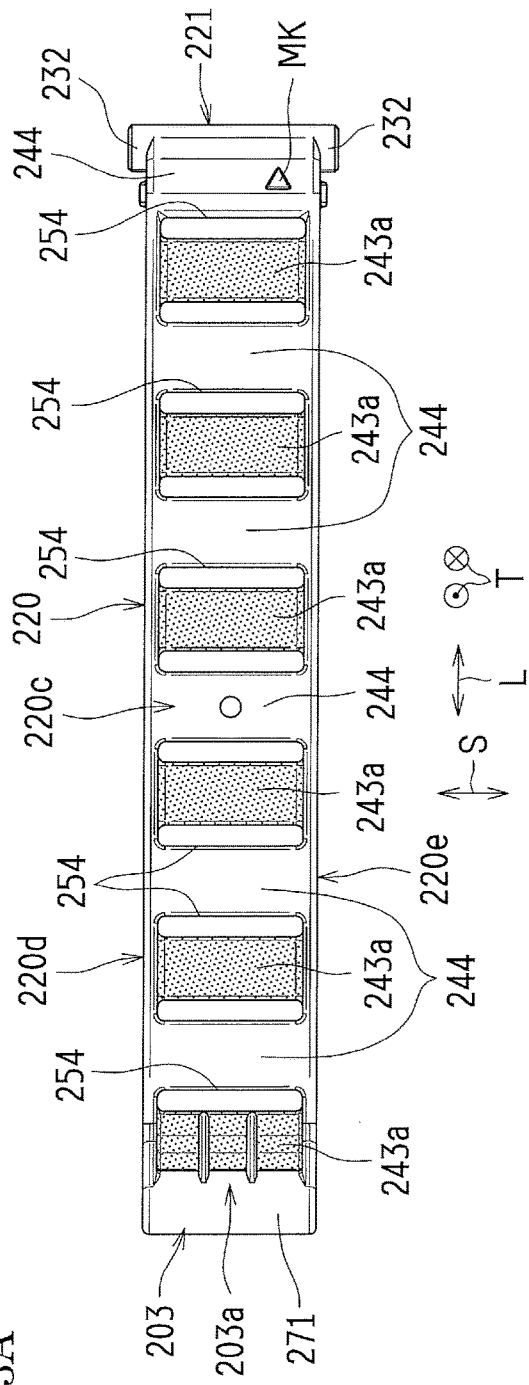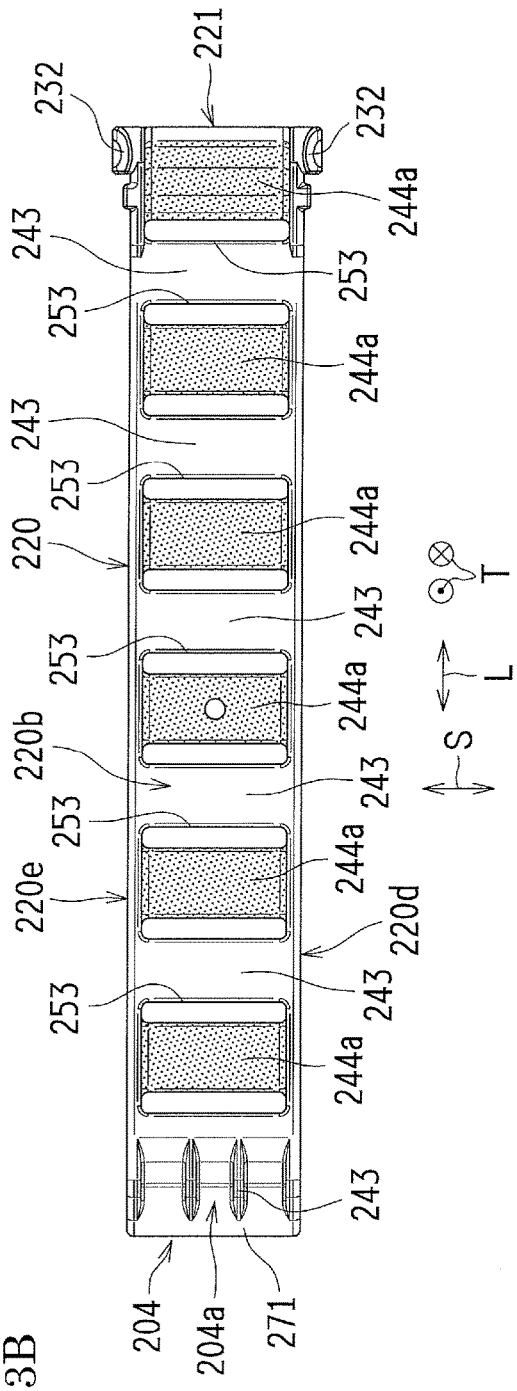

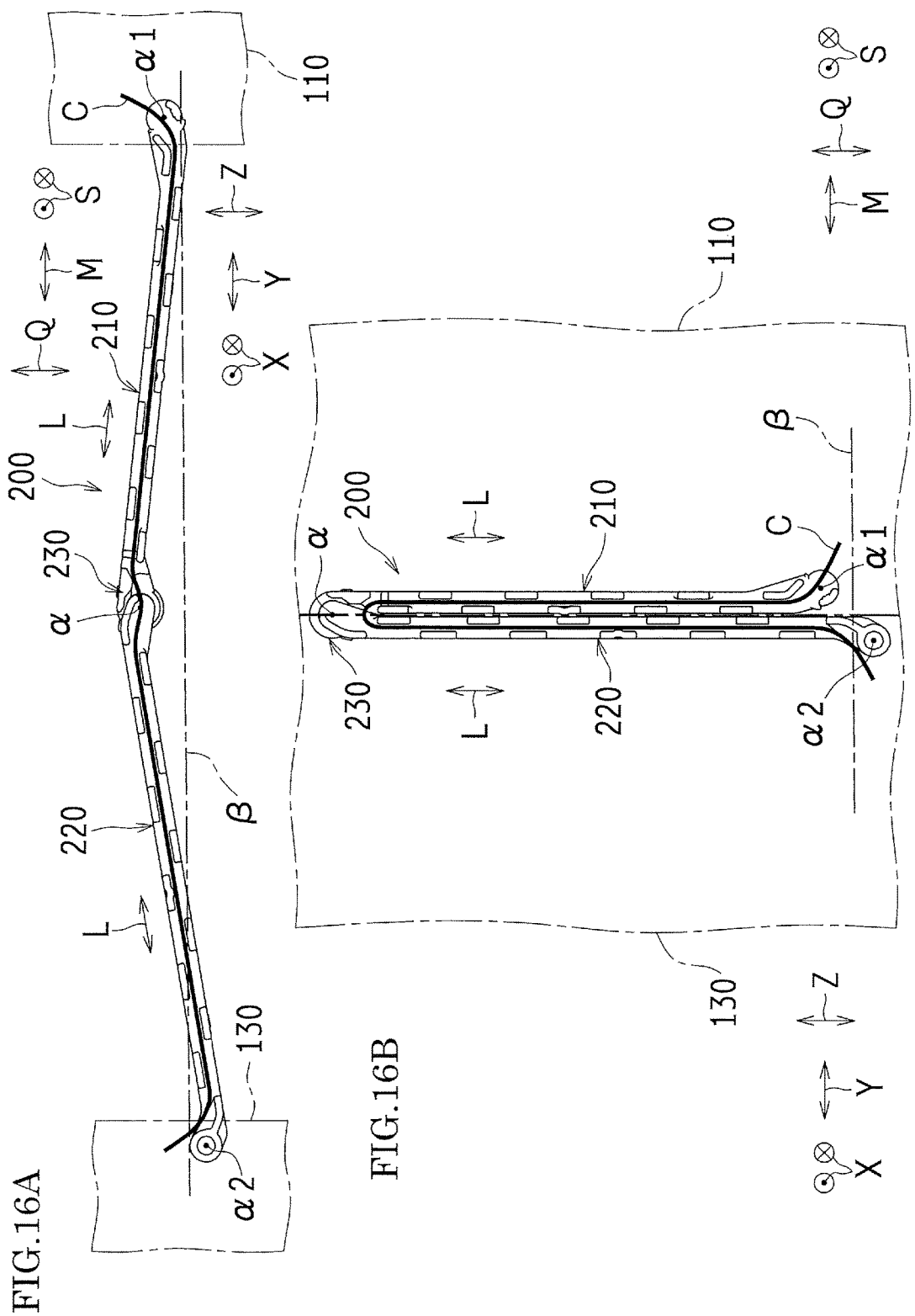

SUPPORT MEMBER CONNECTION MECHANISM AND ELECTRICAL APPARATUS INCLUDING THE SAME

CROSS-REFERENCE TO RELATED APPLICATIONS

The present application claims the benefit of priority to Japanese Patent Application No. 2015-201042 and Japanese Patent Application No. 2016-173565, the entirety of which is incorporated herein by reference, filed on Oct. 9, 2015 and on Sep. 6, 2016 under Section 119(a) of 35 U.S.C.

BACKGROUND ART

Field of the Invention

The present invention relates to a support member connection mechanism and an electrical apparatus including the same (for example, an image forming apparatus such as a copier, a multifunction peripheral (MFP), a printer, and a facsimile machine).

Description of the Related Art

Electrical apparatuses, such as image forming apparatuses, typically include electrical parts including: a power source or a power source board such as a transformer from which power is supplied; an operation part such as a motor that is operated by the power from the power source board; and a control board that controls the operations performed by the operation part. These electrical parts such as a power source, a power source board, an operation part, and a control board are connected to each other via a wiring member (for example, a connection electric wire such as a cable harness or an optical fiber cable). For example, the wiring member connects between the power source and the power source board, between the power source board and the operation part, and between the control board and the operation part.

Some electrical apparatuses include an electrical apparatus main body and a movable member (for example, a slide movable member or an opening/closing member) that is movable relative to the electrical apparatus main body. The electrical parts may be provided to both the electrical apparatus main body and the movable member.

In such an electrical apparatus, the movable member moves relative to the electrical apparatus main body. Thus, the electrical part in the electrical apparatus main body and the electrical part in the movable member are generally connected to each other in the following manner. Specifically, the wiring member on the side of the electrical apparatus main body and the wiring member on the side of the movable member are connected to each other through contact between terminals in connectors such as drawer connectors.

The configuration using the connector for connecting between the electrical part in the electrical apparatus main body and the electrical part in the movable member, involves a high cost and the problem that the conductivity and durability degrade as a result of repeating the contact and separation between the terminals in the connector due to the movement of the movable member.

In view of the above, a support member connection mechanism disclosed in Japanese Translation of PCT International Application Publication No. JP-T-2000-502557 includes: a plurality of support members that are arranged side by side along the longitudinal direction of the wiring member and support the wiring member; and a junction that couples between two adjacent ones of the plurality of support members, in such a manner that the support members can be bent on one side about a rotation axis.

Thus, the support member connection mechanism disclosed in Japanese Translation of PCT International Application Publication No. JP-T-2000-502557 connects between the electrical part in the electrical apparatus main body and the electrical part in the movable member, without using the connector. Thus, a low cost can be achieved, and improved conductivity and durability can be achieved because the wiring member is constantly in the connection state.

In the conventional support member connection mechanism, the wiring member is covered in a bent side junction area including an area of the junction on a bent side of the two adjacent support members coupled in such a manner as to be bendable in one side in the junction. Thus, there are the following problems.

FIG. 23A, FIG. 23B, FIG. 24A, and FIG. 24B are each a schematic cross-sectional view illustrating a state of a wiring member C as a result of opening/closing two adjacent support members 210X and 220X in a conventional support member connection mechanism 200X.

FIG. 23A illustrates an example where the wiring member C is not slacked when the two adjacent support members 210X and 220X are open. FIG. 23B illustrates a state where the two adjacent support members 210X and 220X, in the example illustrated in FIG. 23A, are closed.

FIG. 24A illustrates an example where the wiring member C is slacked when the two adjacent support members 210X and 220X are open. FIG. 24B illustrates a state where the two adjacent support members 210X and 220X, in the example illustrated in FIG. 24A, are closed.

In the conventional support member connection mechanism 200X, as illustrated in FIG. 23A and FIG. 23B, the wiring member C is covered in a bent side junction area 201X including an area of the junction on the bent side of the two support members 210X and 220X, in adjacent portions 211X and 221X, adjacent to each other, as portions of the two adjacent support members 210X and 220X coupled to each other via a rotation shaft 230X serving as the junction (in this example, the wiring member C passes through a side of the rotation shaft 230X opposite to the bent side of the rotation shaft 230X). Thus, when the wiring member C is not slacked in the state where the support members 210X and 220X are open (see FIG. 23A), the wiring member C is pulled when the support members 210X and 220X are closed (see FIG. 23B). As a result, the wiring member C is stretched when the two support members 210X and 220X are closed, and thus the support members 210X and 220X can only be closed by an amount corresponding to a slightly slack amount of the wiring member C, and the support members 210X and 220X can be closed further.

This is because the length of the wiring member C is insufficient by a length corresponding to an amount of increase from a length of central path (L1+L2) of the two support members 210X and 220X in the closed state (see FIG. 23B) to the length of central path (L1+L2) of the support members 210X and 220X in the open state (see FIG. 23A).

The problem is serious especially in a configuration where the wiring member C is unmovable or approximately unmovable in the longitudinal direction L of the wiring member C relative to the support members 210X and 220X, when the two support members 210X and 220X are opened/closed.

FIG. 24A and FIG. 24B illustrate a configuration overcoming this problem. More specifically, the wiring member C is slacked in the state where the two adjacent support members 210X and 220X are open (see FIG. 24A), whereby the two support members 210X and 220X can be closed with no hindrance (see FIG. 24B).

When the wiring member C is slacked in the state where the two support members 210X and 220X are open as described above, an extra portion C1 of the wiring member C is pushed out from an opposite side junction area 202X including an area of the junction on a side opposite to the bent side of the support members 210X and 220X, when the support members 210X and 220X are open (see FIG. 24A). Thus, there is a problem in that the portion C1 of the wiring member C that has been pushed out might be in the way of the user operating the electrical apparatus at a portion near the support member connection mechanism 200X, and that the wiring member C might be broken.

In view of the above, an object of the present invention is to provide a support member connection mechanism in which two adjacent support members can be closed with no hindrance, and problems such as breaking of a wiring member can be prevented when the two adjacent support members are open, and to provide an electrical apparatus including the support member connection mechanism.

SUMMARY OF THE INVENTION

To solve the problem described above, a support member connection mechanism according to an aspect of the present invention includes a plurality of support members that are arranged side by side in a longitudinal direction of a wiring member and are configured to support the wiring member; and a junction configured to couple between two adjacent support members of the plurality of support members in such a manner that the two adjacent support members are bendable to one side about a rotation axis. The wiring member is exposed in a predetermined bent side junction area including an area of the junction on a bent side of the two adjacent support members.

An electrical apparatus according to an aspect of the present invention includes the support member connection mechanism according to the aforementioned aspect of the present invention.

In an exemplary aspect of the present invention, the plurality of support members may have a size in a width direction along the rotation axis longer than a size in a thickness direction orthogonal to both the width direction and the longitudinal direction In an exemplary aspect of the present invention, the wiring member may be covered in a predetermined opposite side junction area including an area of the junction on an opposite side of the bent side of the two adjacent support members.

In an exemplary aspect of the present invention, the plurality of support members may each include a plurality of support portions arranged at an interval along the longitudinal direction.

In an exemplary aspect of the present invention, the support member connection mechanism may be provided in an electrical apparatus including an electrical apparatus main body and a movable member capable of moving relative to the electrical apparatus main body, the plurality of support members may have one end portion rotatably provided to the electrical apparatus main body and have another end portion rotatably provided to the movable member, and the plurality of support members may be configured to pivot in accordance with an operation of moving the movable member relative to the electrical apparatus main body.

In an exemplary aspect of the present invention, the electrical apparatus may further include an attachable/detachable member configured to be detachably attached to the electrical apparatus main body, and the support member connection mechanism may be positioned in an area other than an attaching/detaching operation area needed when the attachable/detachable member is attached/detached.

In an exemplary aspect of the present invention, when the two adjacent support members are opened/closed, the junction may move in a linear direction orthogonal to or approximately orthogonal to both a movement direction in which the movable member moves and an axis direction of the rotation axis.

In an exemplary aspect of the present invention, a regulating member configured to prevent the two adjacent support members from being opened by a predetermined angle or more may be further provided.

In an exemplary aspect of the present invention, a return member configured to return an angle between the two adjacent support members to a smaller angle than a predetermined angle even if the two adjacent support members are opened by the predetermined angle or more may be further provided.

With the present invention, two adjacent support members can be closed with no hindrance and problems such as breaking of a wiring member can be prevented when the two adjacent support members are open.

BRIEF DESCRIPTION OF THE DRAWINGS

FIG. 10A is a plan view illustrating the first support member not supporting the wiring member and a part of the junction.

FIG. 10B is a bottom view illustrating the first support member not supporting the wiring member and the part of the junction.

FIG. 13A is a plan view illustrating the second support member not supporting the wiring member and a part of the junction.

FIG. 13B is a bottom view illustrating the second support member not supporting the wiring member and the part of the junction.

FIG. 16A is a cross-sectional view illustrating the postures of the first support member and the second support member that are adjacent to each other and are open/closed as viewed from the back surface side, and illustrates a state where the first support member and the second support member, with approximately the same length in the longitudinal direction, are open.

FIG. 16B is a cross-sectional view illustrating the postures of the first support member and the second support member that are adjacent to each other and are open/closed as viewed from the back surface side, and illustrates an example where the first support member and the second support member illustrated in FIG. 16A in the closed state point in a linear direction.

DESCRIPTION OF THE EMBODIMENTS

Embodiments of the present invention are described with reference to the drawings.

(Overall Description on Image Forming Apparatus)

Figure 1:
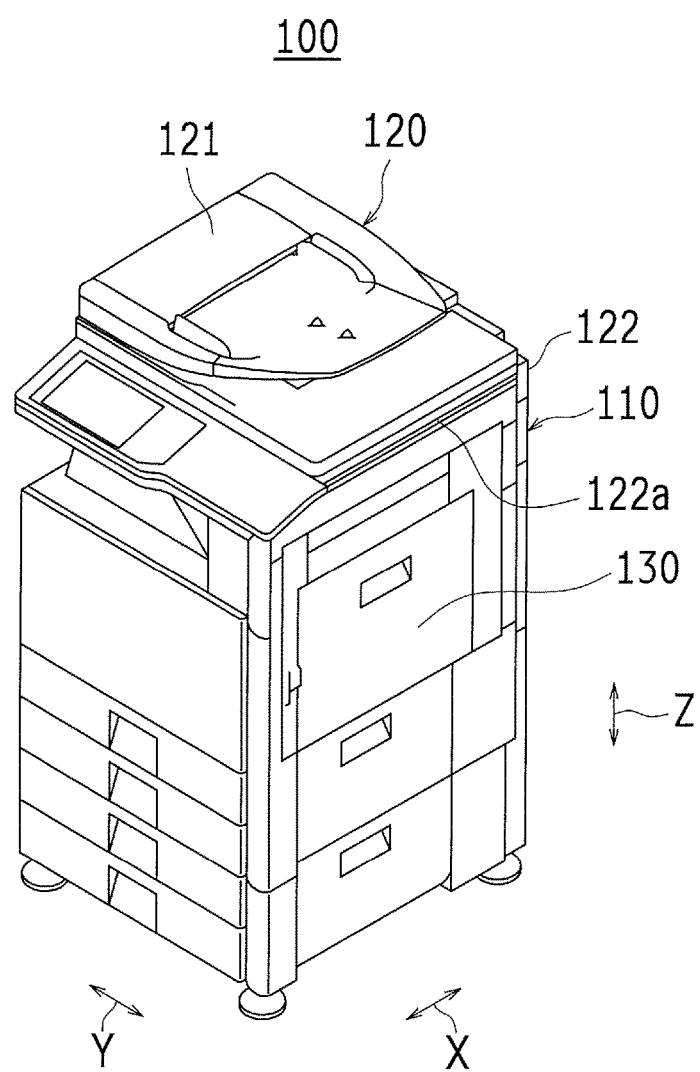
FIG. 1 is a perspective view illustrating a schematic configuration of an image forming apparatus according to an embodiment of the present invention.

FIG. 1 is a perspective view illustrating a schematic configuration of an image forming apparatus 100 according to an embodiment of the present invention.

As illustrated in FIG. 1, the image forming apparatus 100 (an example of an electrical apparatus) includes an image reading device 120 and an image forming apparatus main body 110 (an example of an electrical apparatus main body). The image forming apparatus main body 110 forms a monochrome or color image on a recording sheet, such as recording paper, based on image data read from the image reading device 120 or transmitted thereto from an external device.

The image reading device 120 is placed on an upper surface of the image forming apparatus main body 110, and includes a document feeder 121 and a document reader 122. The document reader 122 reads a document conveyed by the document feeder 121, or reads a document placed on a platen 122a, and outputs image data representing an image of the document thus read.

The image forming apparatus 100 is an electrophotographic image forming apparatus, and is what is known as a tandem color image forming apparatus in which a plurality of image carriers (more specifically, photosensitive bodies) are arranged side by side in a predetermined direction (a horizontal direction Y in this example). In this example, the image forming apparatus 100 is a color multifunction peripheral (MFP) that employs intermediate transferring and can form a full color image. The image forming apparatus 100, which is a tandem color image forming apparatus in the present embodiment, may be a color image forming apparatus of other types or may be a monochrome image forming apparatus.

In FIG. 1, sign X indicates a width direction (depth direction), sign Y indicates a horizontal direction Y orthogonal to the width direction X, and sign Z indicates a vertical direction (height direction). The same applies to FIG. 2, FIG. 3, FIG. 15A, FIG. 15B, FIG. 16A, FIG. 16B, FIG. 17A, and FIG. 17B described later.

The image forming apparatus 100 further includes a movable member 130 that is movable relative to the image forming apparatus main body 110. In this example, the movable member 130 serves as a slide movable member (more specifically, a side door part, a right door part in this example) that defines a sheet conveyance path (more specifically, a conveyance path for a recording sheet) in a closed state.

Figure 2:
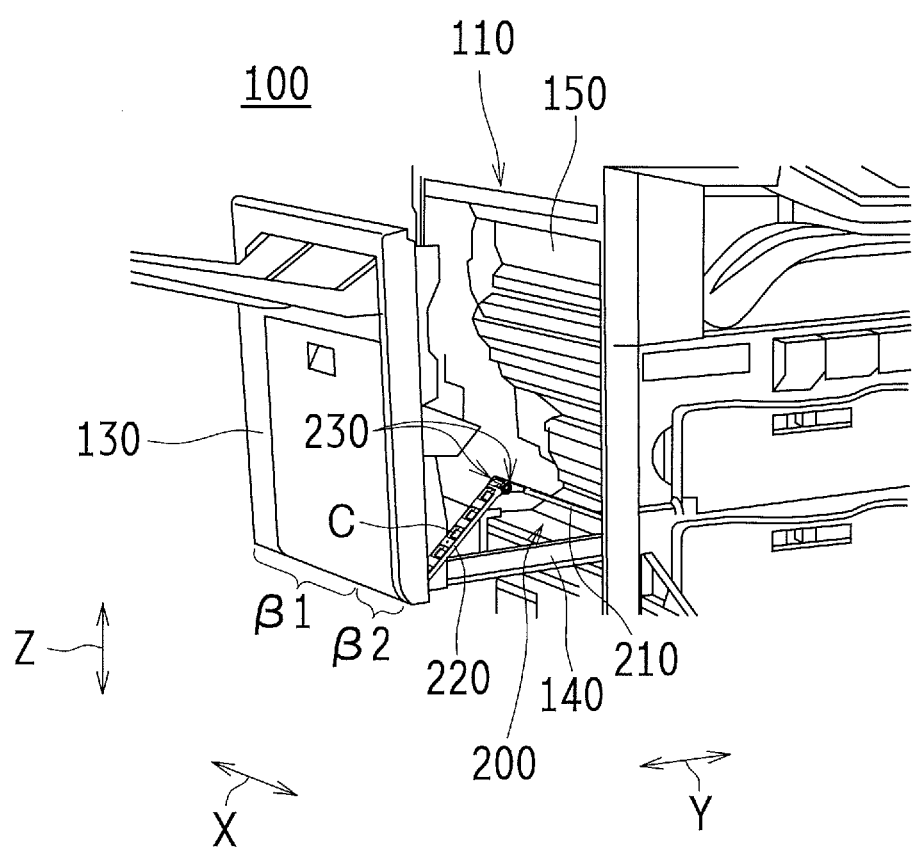
FIG. 2 is a perspective view illustrating a state where a movable member is separated from an image forming apparatus main body in the image forming apparatus as viewed from a right side of a back surface side.

FIG. 2 is a perspective view illustrating a state where the movable member 130 is separated from the image forming apparatus main body 110 in the image forming apparatus 100 as viewed from a right side of a back surface side.

The movable member 130 can move back and forth in a predetermined slide direction (the horizontal direction Y in this example) relative to the image forming apparatus main body 110.

More specifically, the movable member 130 is supported on the image forming apparatus main body 110 via a pair of slide members 140 and 140. In FIG. 2, only the slide member 140 as one of the pair of slide members 140 and 140 on the other side (back surface side) is illustrated.

More specifically, the movable member 130 is provided on a right side surface of the image forming apparatus main body 110 as viewed from the front. One of the pair of slide members 140 and 140 is disposed on one side (front surface side) of the image forming apparatus main body 110 in the width direction X, and on a lower side of the image forming apparatus main body 110 in the vertical direction Z, and slidably supports the one side (front surface side) of the movable member 130 in the width direction X. The other slide member 140 is disposed on the other side (back surface side) of the image forming apparatus main body 110 in the width direction X and on the lower side of the image forming apparatus main body 110 in the vertical direction Z, and slidably supports the other side (back surface side) of the movable member 130 in the width direction X.

The image forming apparatus 100 further includes a support member connection mechanism 200 (for example, a protective cover connection mechanism) according to the present embodiment. Components in FIG. 2 with reference numerals not described above will be described later.

The support member connection mechanism 200 is described below with reference to FIG. 3 to FIG. 22C.

Description on Support Member Connection Mechanism

First Embodiment

Figure 3:
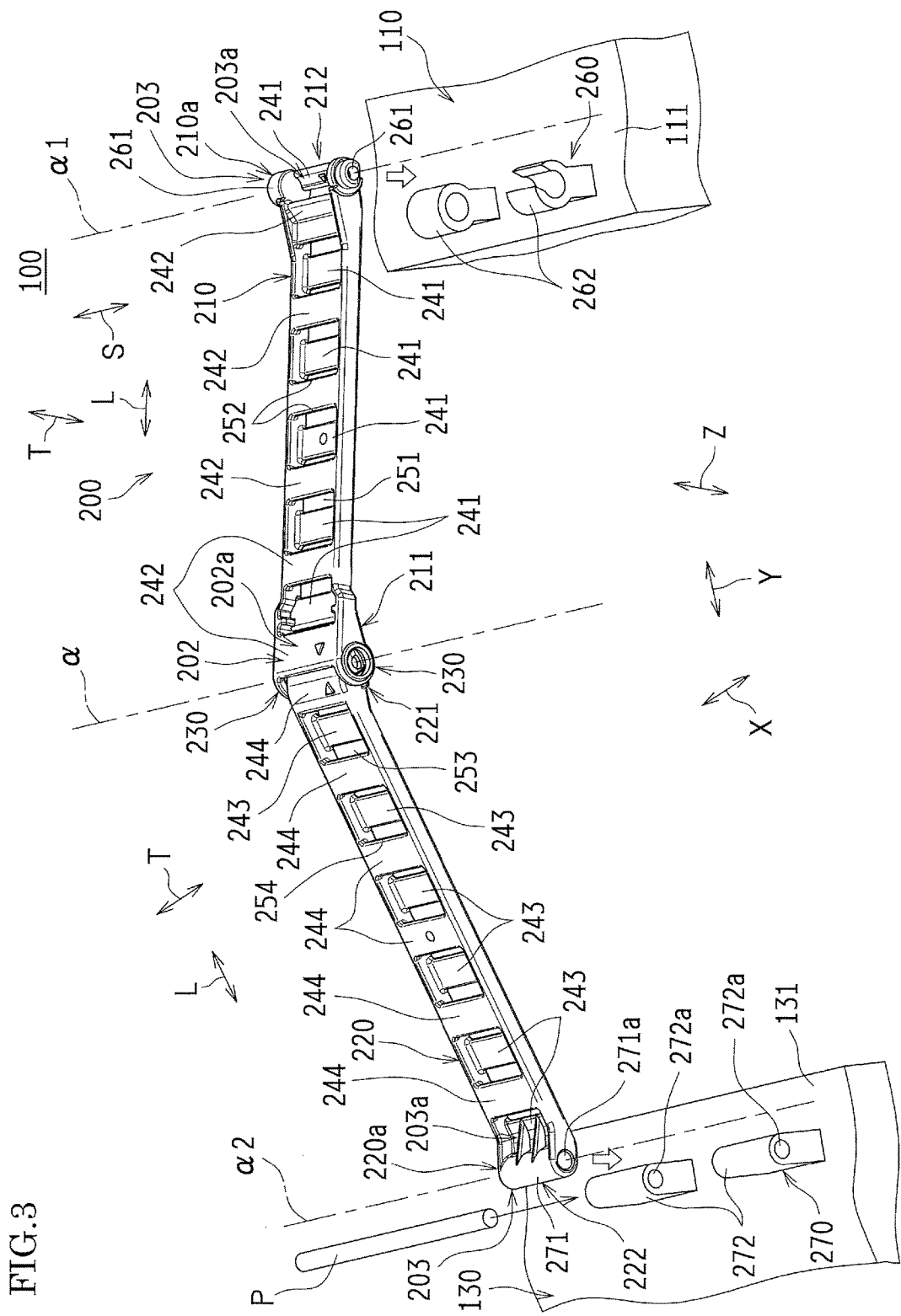
FIG. 3 is an exploded perspective view illustrating a state where a support member connection mechanism according to a first embodiment is removed from the image forming apparatus, and illustrates a state where a first support member and a second support member not supporting a wiring member are open, as viewed from an upper right side of the back surface side.

FIG. 3 is an exploded perspective view illustrating a state where the support member connection mechanism 200 according to the first embodiment is removed from the image forming apparatus 100, and illustrates a state where a first support member 210 and a second support member 220 not supporting a wiring member C are open, as viewed from an upper right side of the back surface side.

Figure 4:
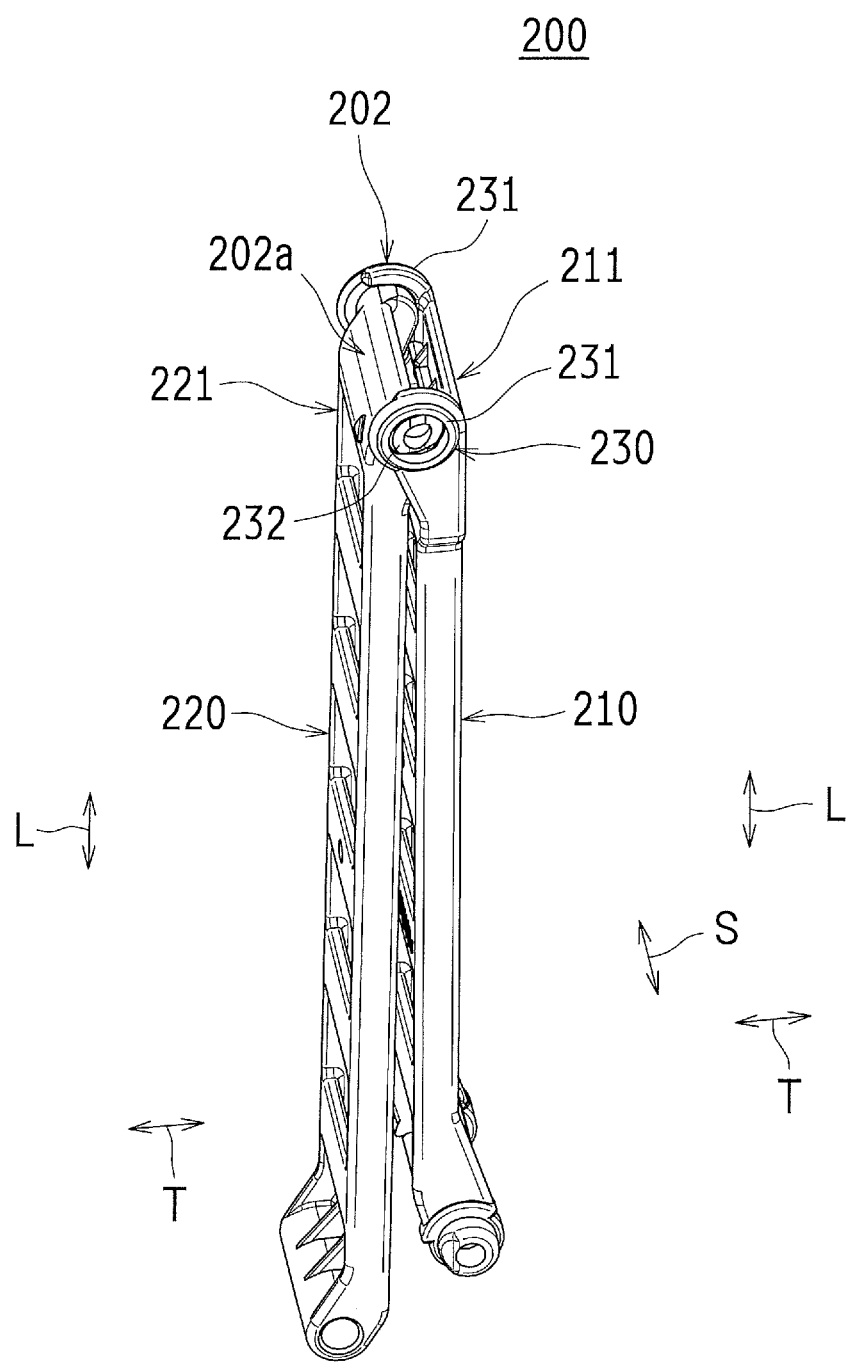
FIG. 4 is a perspective view illustrating a state in the support member connection mechanism according to the first embodiment where the first support member and the second support member not supporting the wiring member are closed, as viewed from the upper right side of the back surface side.

FIG. 4 is a perspective view illustrating a state in the support member connection mechanism 200 according to the first embodiment where the first support member 210 and the second support member 220 not supporting the wiring member C are closed, as viewed from the upper right side of the back surface side.

Figure 5:
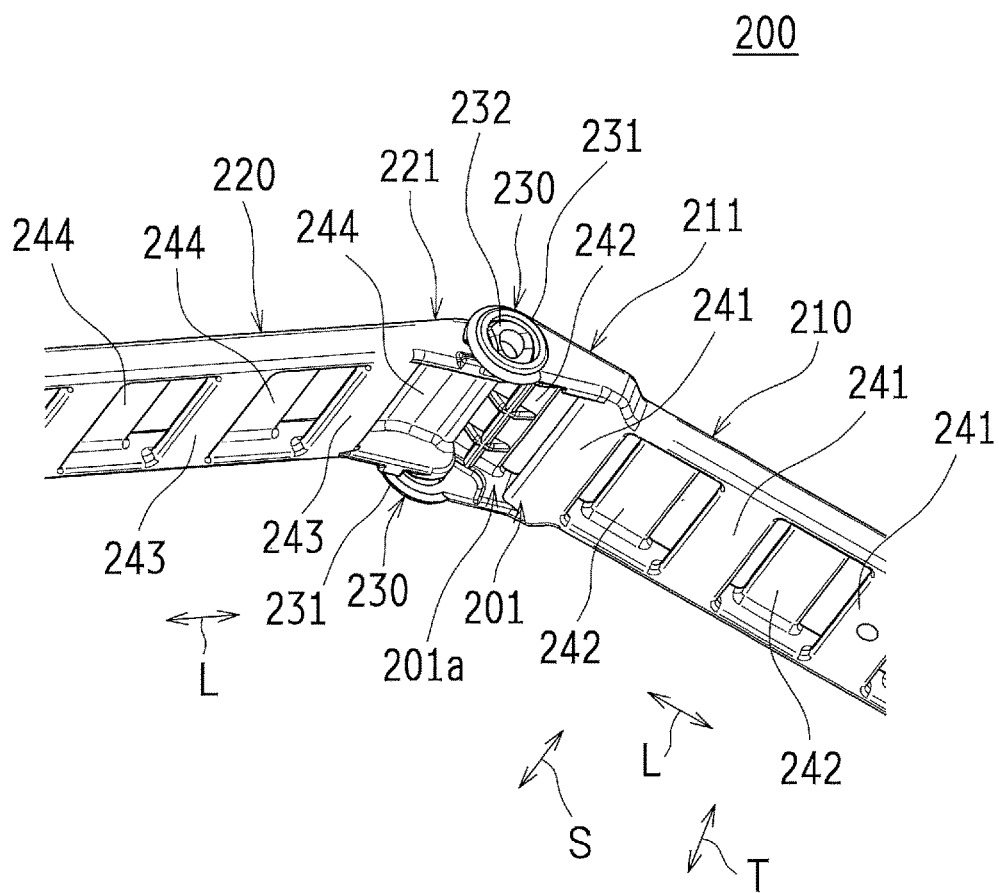
FIG. 5 is a perspective view illustrating a state of an area of a junction, in the support member connection mechanism according to the first embodiment, between the first support member and the second support member that are not supporting the wiring member and are open, as viewed from a lower right side of the back surface side.
Figure 6:
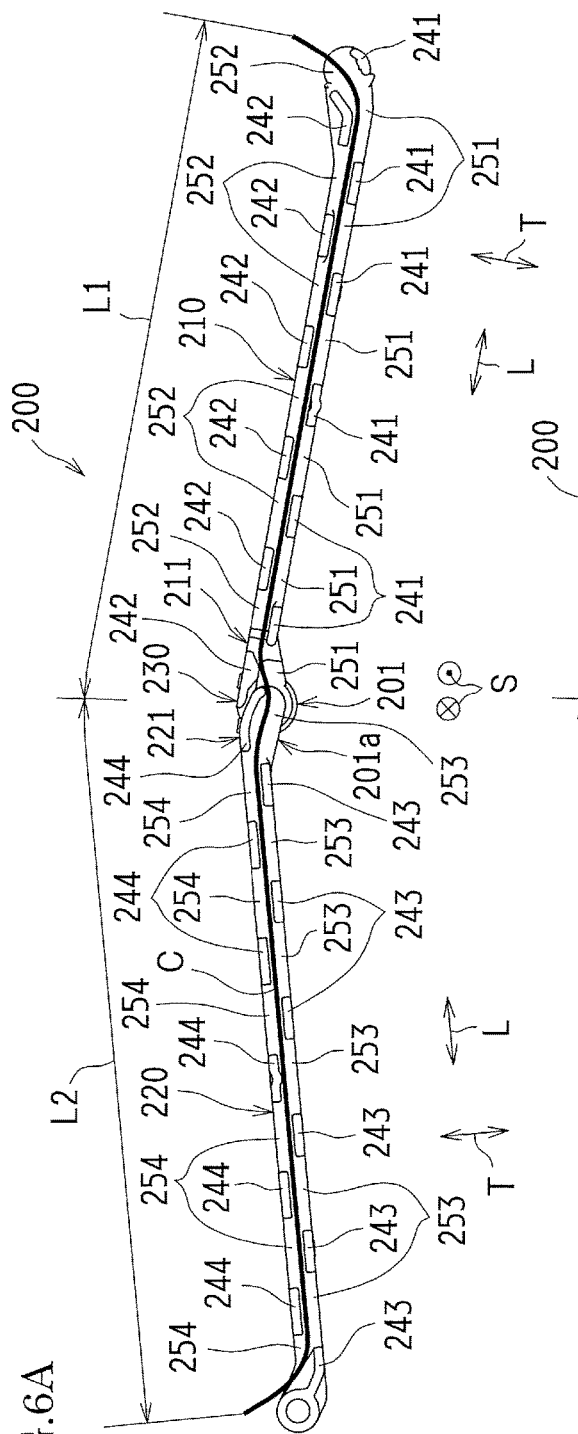
FIG. 6A is a schematic cross-sectional view illustrating a state of the wiring member as a result of opening/closing the first support member and the second support member in the support member connection mechanism according to the first embodiment, and illustrates an example where the wiring member is not slacked in a state where the first support member and the second support member are open.
FIG. 6B is a schematic cross-sectional view illustrating a state of the wiring member as a result of opening/closing the first support member and the second support member in the support member connection mechanism according to the first embodiment, and illustrates a state where the first support member and the second support member, in the example illustrated in FIG. 6A, are closed.

FIG. 5 is a perspective view of illustrating a state of an area of a junction 230, in the support member connection mechanism 200 according to the first embodiment, between the first support member 210 and the second support member 220 that are not supporting the wiring member C and are open, as viewed from a lower right side of the back surface side.

FIG. 6A and FIG. 6B are schematic cross-sectional views illustrating states of the wiring member C as a result of opening/closing the first support member 210 and the second support member 220 in the support member connection mechanism 200 according to the first embodiment. FIG. 6A illustrates an example where the wiring member C is not slacked in a state where the first support member 210 and the second support member 220 are open. FIG. 6B illustrates a state where the first support member 210 and the second support member 220, in the example illustrated in FIG. 6A, are closed.

Figure 7:
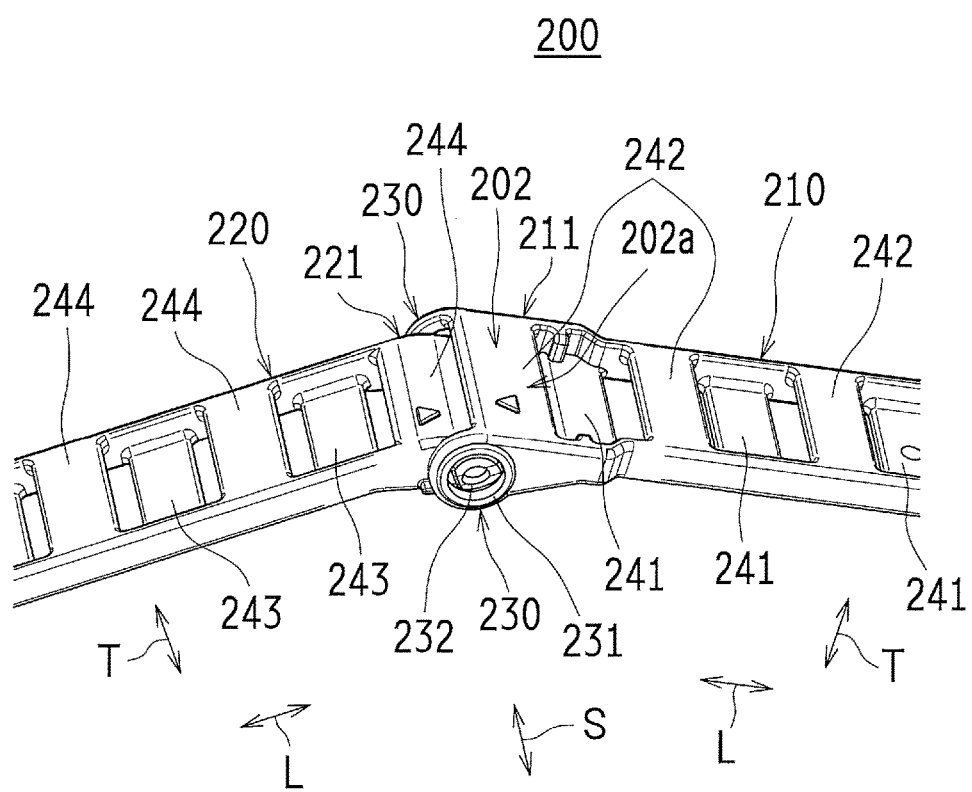
FIG. 7 is a perspective view of the area of the junction between the first support member and the second support member that are not supporting the wiring member and are open in the support member connection mechanism according to the first embodiment, as viewed from the upper right side of the back surface side.

FIG. 7 is a perspective view of the area of the junction 230 between the first support member 210 and the second support member 220 that are not supporting the wiring member C and are open in the support member connection mechanism 200 according to the first embodiment, as viewed from an upper right side of the back surface side.

Figure 8:
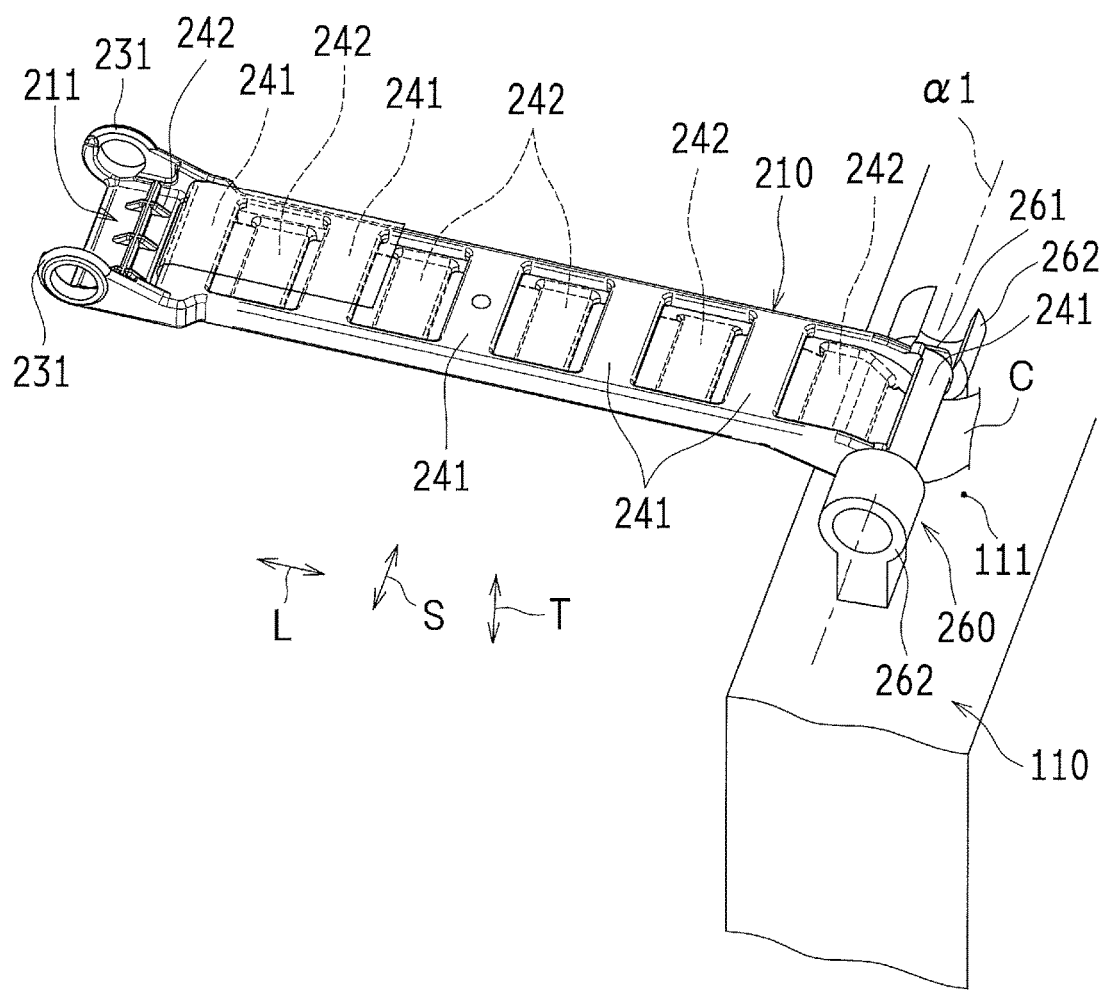
FIG. 8 is a perspective view illustrating a state of the first support member supporting the wiring member and a part of the junction as a result of rotation about a rotation axis, as viewed from the upper right side of the front surface side.
Figure 9:
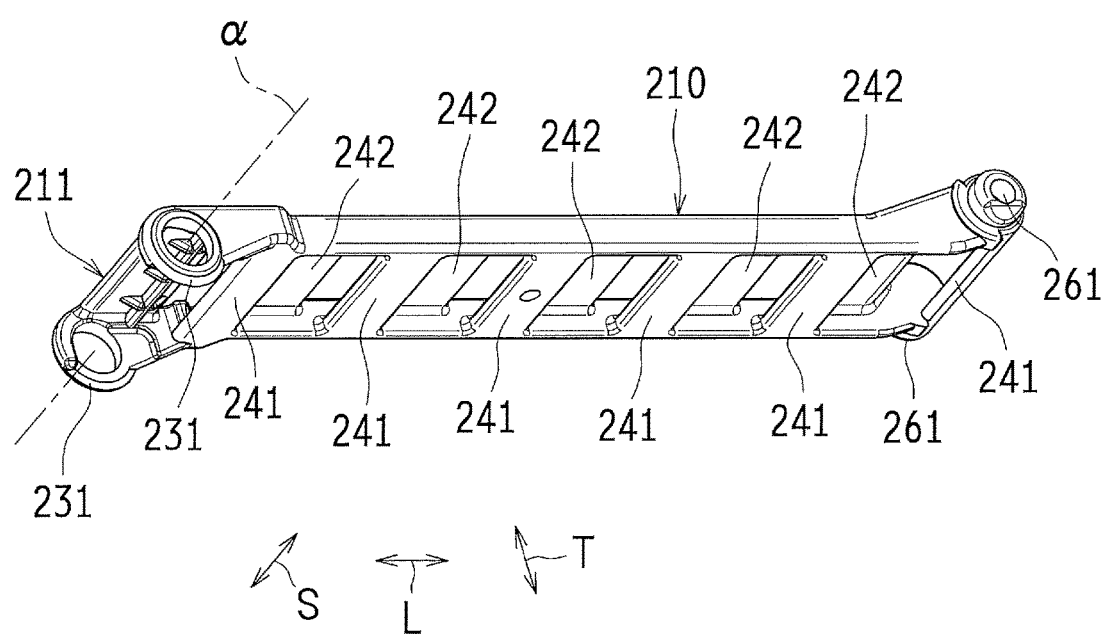
FIG. 9 is a perspective view of the first support member not supporting the wiring member and a part of the junction, as viewed from the lower right side of the back surface side.

FIG. 8 is a perspective view illustrating a state of the first support member 210 supporting the wiring member C and a part of the junction 230 as a result of rotation about a rotation axis α, as viewed from the upper right side of the front surface side. FIG. 9 is a perspective view of the first support member 210 not supporting the wiring member C and a part of the junction 230, as viewed from the lower right side of the back surface side.

FIG. 10A, FIG. 10B, FIG. 11A, and FIG. 11B are respectively a plan view, a bottom view, a side view from a side of the junction 230, and a rear view illustrating the first support member 210 not supporting the wiring member C and a part of the junction 230.

Figure 12:
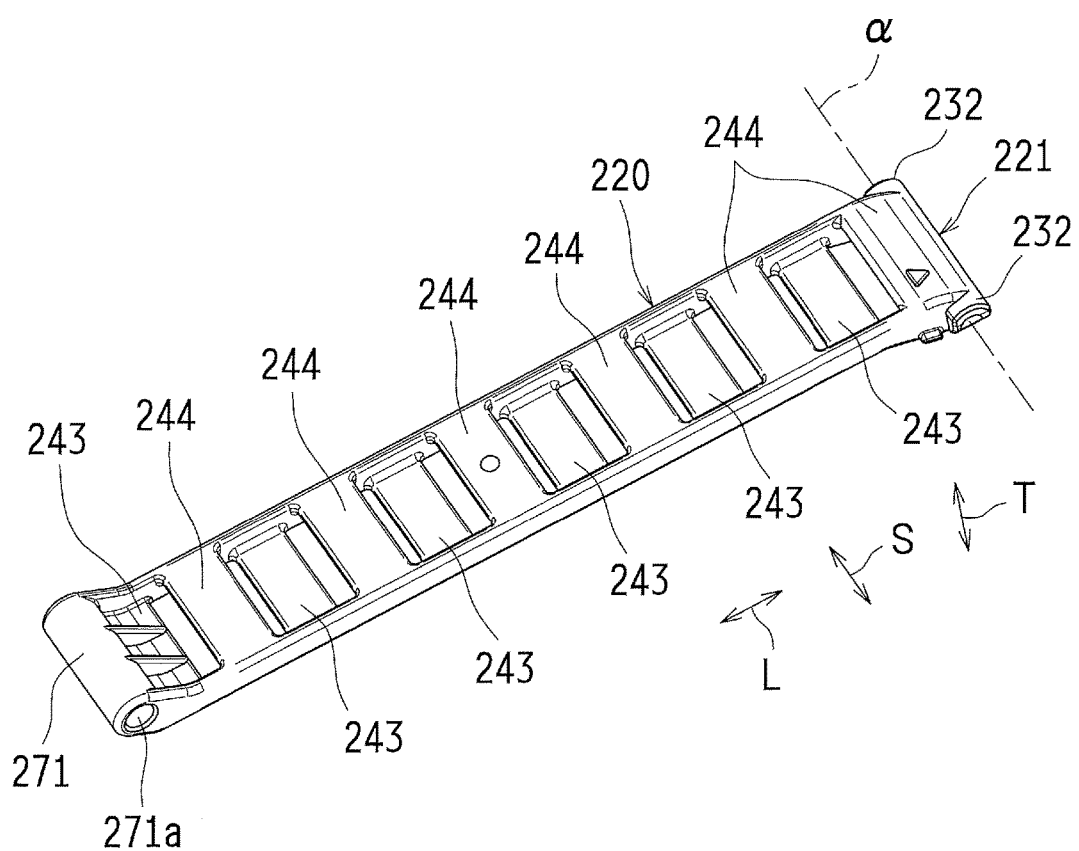
FIG. 12 is a perspective view of the second support member not supporting the wiring member and a part of the junction as viewed from the upper right side of the back surface side.

FIG. 12 is a perspective view of the second support member 220 not supporting the wiring member C and a part of the junction 230 as viewed from the upper right side of the back surface side.

FIG. 13A, FIG. 13B, FIG. 14A, and FIG. 14B are respectively a plan view, a bottom view, a side view from a side of the junction 230, and a rear view illustrating the second support member 220 not supporting the wiring member C and a part of the junction 230.

The support member connection mechanism 200 includes: a plurality of (two in this example) support members (for example, the protective covers) (the first support member 210 and the second support member 220 in this example); and the junction 230 (see FIG. 3 to FIG. 5, FIG. 6A, FIG. 6B, and FIG. 7). In this example, the first support member 210 is disposed on a side of the image forming apparatus main body 110 (also see FIG. 2), and the second support member 220 is disposed on a side of the movable member 130 (also see FIG. 2).

The first support member 210 and the second support member 220 are arranged side by side along a longitudinal direction L of the wiring member C (see FIG. 6A, FIG. 6B, and FIG. 8). The first support member 210 and the second support member 220 are configured to support the wiring member C. The junction 230 is configured to couple between two adjacent ones (the first support member 210 and the second support member 220 in this example) of the plurality of support members in such a manner that the support members are bendable in one side about the rotation axis α (see FIG. 3, FIG. 9, and FIG. 12).

The rotation axis α extends in a direction orthogonal or approximately orthogonal to the longitudinal direction L. In this example, the rotation axis α extends in the width direction X of the image forming apparatus main body 110. The support member connection mechanism 200 is disposed on the other side (back surface side) of the image forming apparatus main body 110 in the width direction X and on the lower side of the image forming apparatus main body 110 in the vertical direction Z (see FIG. 2).

In the support member connection mechanism 200 according to the first embodiment, the plurality of support members (the first support member 210 and the second support member 220 in this example) have one end portion rotatably provided to the image forming apparatus main body 110, and the other end portion rotatably provided to the movable member 130. The plurality of support members (the first support member 210 and the second support member 220 in this example) are configured to pivot in accordance with an operation of moving the movable member 130 relative to the image forming apparatus main body 110.

More specifically, an end portion 210a (see FIG. 3) of the support member (the first support member 210 in this example), as one of the plurality of support members (the first support member 210 and the second support member 220 in this example), that is on the one end and not adjacent to another support member is disposed in such a manner as to be rotatable relative to the image forming apparatus main body 110 about a main body side rotation axis α1 (see FIG. 3 and FIG. 8). An end portion 220a (see FIG. 3) of the support member (the second support member 220 in this example) that is on the other end and not adjacent to another support member is disposed in such a manner as to be rotatable relative to the movable member 130 about a movable member side rotation axis α2 (see FIG. 3). The main body side rotation axis α1 and the movable member side rotation axis α2 each extend in an axis direction S.

The plurality of support members (the first support member 210 and the second support member 220 in this example) are configured to pivot about the rotation axis α, the main body side rotation axis α1, and the movable member side rotation axis α2 in accordance with the operation of moving the movable member 130 relative to the image forming apparatus main body 110 (a slide movement operation in the horizontal direction Y in this example).

In this example, the plurality of support members (the first support member 210 and the second support member 220 in this example) are configured to be bent in such a manner that the junction 230 moves upward, for the sake of maintenance.

In the first embodiment, the image forming apparatus 100 further includes an attachable/detachable member 150 (a fixing device (see FIG. 2) in this example) that is detachably attached to the image forming apparatus main body 110. In this example, the attachable/detachable member 150 is inserted and pulled out to and from the image forming apparatus main body 110, along the horizontal direction.

The support member connection mechanism 200 is positioned in an area (32 (see FIG. 2) other than an attaching/detaching operation area (31 (see FIG. 2) that is an area needed when the attachable/detachable member 150 is attached/detached. In this example, the area (32 other than the attaching/detaching operation area (31 is an area in the image forming apparatus 100 excluding the attaching/detaching operation area (31. The support member connection mechanism 200 may be disposed on the other side of the image forming apparatus 100.

The wiring member C is exposed at a predetermined bent side junction area 201 (that is, an inner side portion) (see FIG. 5, FIG. 6A, and FIG. 6B) including an area of the junction 230 on a bent side of the two adjacent support members (the first support member 210 and the second support member 220 in this example).

More specifically, the two adjacent support members (the first support member 210 and the second support member 220 in this example), coupled to each other via the junction 230, have an adjacent portion 211 (see FIG. 3 to FIG. 5, FIG. 6A, FIG. 6B, FIG. 7 to FIG. 9, FIG. 10A, FIG. 10B, FIG. 11A and FIG. 11B) and an adjacent portion 221 (see FIG. 3 to FIG. 5, FIG. 6A, FIG. 6B, FIG. 7, FIG. 12, FIG. 13A and FIG. 13B, FIG. 14A and FIG. 14B) that are adjacent to each other. An opening portion 201a (see FIG. 5, FIG. 6A, and FIG. 6B) from which the wiring member C is exposed is formed in the bent side junction area 201 of at least one of the adjacent portions 211 and 221 (both or either).

As described above, in the support member connection mechanism 200, the opening portion 201a is formed in the bent side junction area 201 between the adjacent portions 211 and 221. Even if the wiring member C is not allowed to be slacked in the state where the two adjacent support members (the first support member 210 and the second support member 220 in this example) are open (see FIG. 6A) and also even if the two support members are closed in this state and the wiring member C is pulled (see FIG. 6B), the opening portion 201a allows an increase in a length of central paths (L1+L2) from that when the two support members are open to that when the two support members are closed. Thus, a closing operation of the two support members can be smoothly performed.

In FIG. 6A, the wiring member C is slightly curved downwards at the adjacent portions 211 and 221, and thus seems to be slacked. This is because the wiring member C is in contact with a support portion 244, and thus is not intentionally slacked. All things considered, the length of central paths (L1+L2) is equal to or approximately equal to the length of the wiring member C disposed through the two support members, in the state where the two adjacent support members (the first support member 210 and the second support member 220 in this example) are open.

In this example, the wiring member C is configured to be unmovable or approximately unmovable in the longitudinal direction L relative to the two adjacent support members, when the plurality of support members (the first support member 210 and the second support member 220 in this example) are opened and closed. Examples of such a configuration includes: a configuration in which the wiring member C has no added length (no extra length) on a side of the image forming apparatus main body 110 and/or the movable member 130; and/or a configuration in which the wiring member C is fixed to at least one (one or both) of the two support members (the first support member 210 and the second support member 220 in this example) on the side of the image forming apparatus main body 110 and/or the movable member 130.

In the first embodiment, the plurality of support members (the first support member 210 and the second support member 220 in this example) have a size in the width direction along the rotation axis α (the axis direction S of the rotation axis α) larger than a size in a thickness direction (orthogonal direction T) orthogonal to both the width direction and the longitudinal direction L.

In the first embodiment, the wiring member C is a flat cable. The flat cable is a cable having a plate shape in which a plurality of electric wires are arranged side by side in parallel or approximately parallel with the axis direction S. An example of the flat cable includes a flexible flat cable (FFC). A typical example of the FFC has a configuration in which conductors are arranged side by side in the axis direction S at regular interval and are clamped with two flexible resin films.

The plurality of support members (the first support member 210 and the second support member 220 in this example) supports the flat cable in the width direction (axis direction S).

In the first embodiment, the wiring member C is covered in a predetermined opposite side junction area 202 (that is, an outer side portion) (FIG. 3, FIG. 4, and FIG. 7) including an area of the junction 230 opposite to the bend side of the two adjacent support members (the first support member 210 and the second support member 220 in this example).

More specifically, a covering portion 202a (FIG. 3, FIG. 4, and FIG. 7) is provided in the opposite side junction area 202 opposite to the bent side of the adjacent portion of at least one (one or both) of the adjacent portions 211 and 221. Thus, the covering portion 202a cover the wiring member C so that the wiring member C is unexposed when the two support members are open.

In the first embodiment, the plurality of support members (the first support member 210 and the second support member 220 in this example) are provided with a plurality of support portions 241 to 244 (FIG. 3, FIG. 5, FIG. 6A, FIG. 6B, FIG. 7 to FIG. 9, FIG. 10A, FIG. 10B, FIG. 12, FIG. 13A, and FIG. 13B) that are arranged at an interval (a predetermined interval in this example) in the longitudinal direction L. For example, the plurality of support portions 241 to 244 support and protect/hold the wiring member C.

More specifically, the plurality of support members (the first support member 210 and the second support member 220 in this example) are each provided with the support portions 241 and 242, or the support portions 243 and 244 that are alternately arranged on one side and the other side in the direction orthogonal to or approximately orthogonal to the longitudinal direction L (the orthogonal direction T orthogonal to or approximately orthogonal to both the axis direction S and the longitudinal direction L in this example) (more specifically, the thickness direction) and are arranged in at an interval (a predetermined interval in this example) along the longitudinal direction L. The support portions 241 to 244 can protect the wiring member C, and can hold the wiring member C between inner side surfaces 241a and 242a (see FIG. 10A and FIG. 10B) of the support portions 241 and 242 on one side and between inner side surfaces 243a and 244a (see FIG. 13A and FIG. 13B) of the support portions 243 and 244 on the other side.

In the first embodiment, the junction 230 includes first engaging portions 231 and 231 (see FIG. 4, FIG. 5, FIG. 7 to FIG. 9, FIG. 10A, FIG. 10B, FIG. 11A, and FIG. 11B) and second engaging portions 232 and 232 (see FIG. 4, FIG. 5, FIG. 7, FIG. 12, FIG. 13A, FIG. 13B, FIG. 14A, and FIG. 14B). The first engaging portions 231 and 231 are provided on both end portions (both side plates in this example) in the axis direction S on one support member (the first support member 210 in this example) of the two adjacent support members (the first support member 210 and the second support member 220 in this example). The second engaging portions 232 and 232 are disposed on both end portions (both side plates in this example) in the axis direction S on the other support member (the second support member 220 in this example). The first engaging portions 231 and 231 and the second engaging portions 232 and 232 are engaged to each other in such a manner as to be rotatable about the rotation axis α.

Ones of the first engaging portions 231 and 231 and the second engaging portions 232 and 232 (the first engaging portions 231 and 231 in this example) are formed to have a ring shape with a circular hole formed through the axis direction S, whereas the other ones of the engaging portions (the second engaging portions 232 and 232 in this example) are formed to have a cylindrical shape protruding in the axis direction S to be inserted in the ones of the engaging portions (the first engaging portions 231 and 231 in this example). Thus, when the first engaging portions 231 and 231 and the second engaging portions 232 and 232 are engaged with each other, inner circumference surfaces of the engaging portions (the first engaging portions 231 and 231 in this example) having the ring shape are in slidable contact with outer circumference surfaces of the engaging portions (the second engaging portions 232 and 232 in this example) having the cylindrical shape.

In this example, the first support member 210, the second support member 220, the first engaging portions 231 and 231, and the second engaging portions 232 and 232 are made of a flexible member such as resin. The first support member 210 and the first engaging portions 231 and 231 are integrally formed. The second support member 220 and the second engaging portions 232 and 232 are integrally formed.

The first support member 210, provided with the first engaging portions 231 and 231, and the second support member 220, provided with the second engaging portions 232 and 232, are each elastically deformable in the axis direction S.

More specifically, one (the second support member 220 in this example) of the two adjacent support members (the first support member 210 and the second support member 220 in this example) is detachably attached to the other (the first support member 210 in this example).

In the support member connection mechanism 200 having the configuration described above, the one support member (the first support member 210 in this example) is attached to the other support member (second support member 220 in this example) in the following manner. Specifically, the other engaging portions (the second engaging portions 232 and 232 in this example) on both end portions of the other support member are fit in the one engaging portions (the first engaging portions 231 and 231 in this example) on both end portions of the one support member in the axis direction S, with the one engaging portions pushed in the axis direction S to be expanded. In the first embodiment, the other engaging portions (the second engaging portions 232 and 232 in this example) are inclined in such a manner as to be thicker in the axis direction S as it get farther from an inserted side of tip portions (see FIG. 14A) toward the opposite side of the inserted side, in a direction (the orthogonal direction T in this example) in which the other engaging portions are inserted in the one engaging portions (the first engaging portions 231 and 231 in this example). Thus, the other engaging portions (the second engaging portions 232 and 232 in this example) can be easily fit in the one engaging portions (the first engaging portions 231 and 231 in this example).

The junction 230 may include a rotation shaft that has a center matching the rotation axis α and couples between the two adjacent support members (the first support member 210 and the second support member 220 in this example). The rotation shaft may bridge between the one side end and the other side end of the support members in the axis direction S. In this configuration, the wiring member C passes through the bent side of the rotation shaft in the opening portion 201a through which the wiring member C is exposed.

(Detail on Support Member Connection Mechanism 200)

The first support member 210 and the second support member 220 each extend in the longitudinal direction L and have a tubular shape with both end surfaces in the longitudinal direction L open.

In this example, the first support member 210 and the second support member 220 each have a box shape, with a size in the longitudinal direction L larger than a size in the axis direction S and the size in the axis direction S longer than a size in the orthogonal direction T.

The first support member 210 and the second support member 220 each have end portions, on side on which the members are coupled to each other in the longitudinal direction L, slightly curved inward (more specifically, inclined by an amount with which the support members in the closed state can be maintained to be in a parallel or an approximately parallel form) as viewed from the front.

Figure 11A:
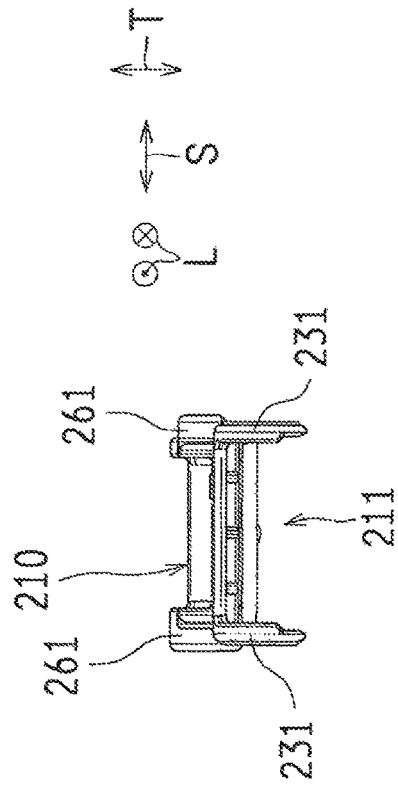
FIG. 11A is a side view illustrating the first support member not supporting the wiring member and the part of the junction, as viewed from a side of the junction.
Figure 11B:
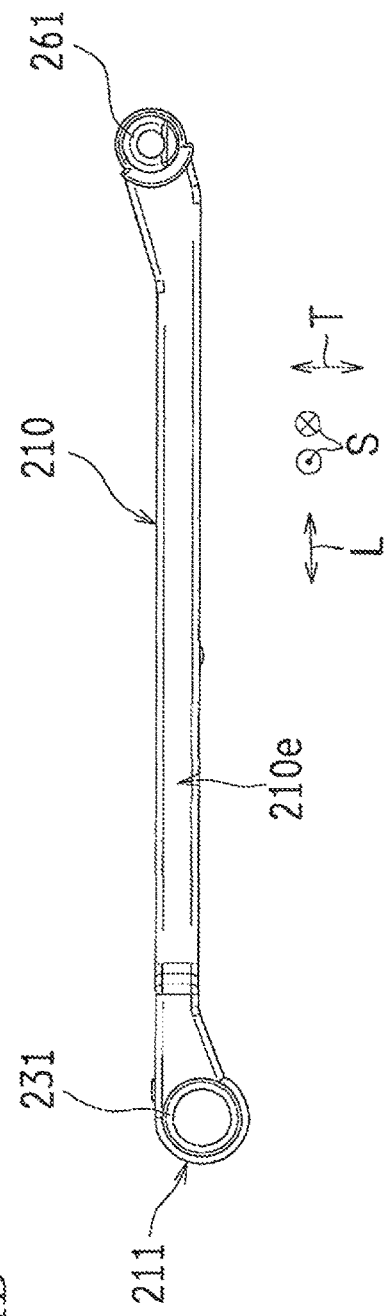
FIG. 11B is a rear view illustrating the first support member not supporting the wiring member and the part of the junction.

The first support member 210 includes a first side plate 210b (see FIG. 10B), a second side plate 210c (see FIG. 10A), a third side plate 210d (see FIG. 10A and FIG. 10B), and a fourth side plate 210e (see FIG. 10A, FIG. 10B, and FIG. 11B). The first side plate 210b and the second side plate 210c are parallel or approximately parallel to each other. The first side plate 210b and the second side plate 210c extend in both the longitudinal direction L and the axis direction S. The third side plate 210d and the fourth side plate 210e are parallel or approximately parallel to each other. The third side plate 210d and the fourth side plate 210e each extend in both the longitudinal direction L and the orthogonal direction T.

The third side plate 210d and the fourth side plate 210e of the first support member 210 at least have portions, provided with the first engaging portions 231 and 231, elastically deformable in the axis direction S.

The first side plate 210b and the second side plate 210c of the first support member 210 are provided with the support portions 241 to 241 and 242 to 242 and openings 251 to 251 and 252 to 252 (see FIG. 3, FIG. 6A, FIG. 6B, FIG. 10A, and FIG. 10B) alternately arranged along the longitudinal direction L.

Figure 14A:
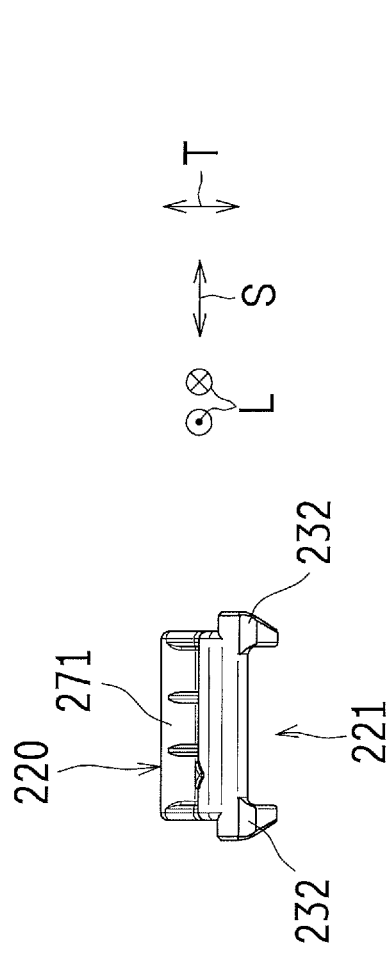
FIG. 14A is a side view illustrating the second support member not supporting the wiring member and the part of the junction, as viewed from a side of the junction.
Figure 14B:
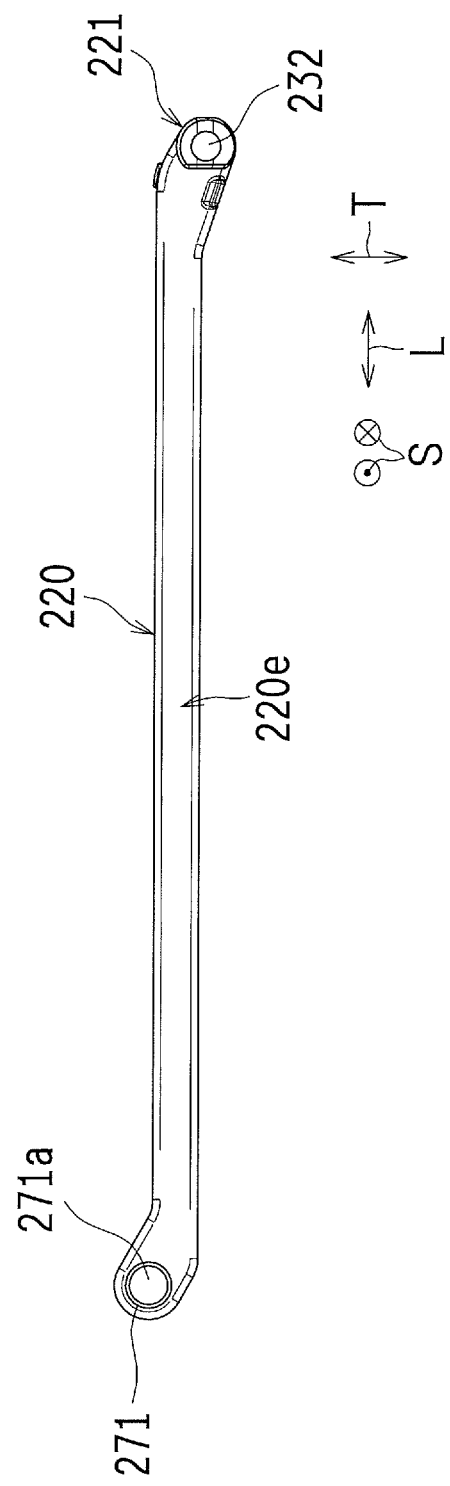
FIG. 14B is a rear view illustrating the second support member not supporting the wiring member and the part of the junction.

The second support member 220 includes a first side plate 220b (see FIG. 13B), a second side plate 220c (see FIG. 13A), a third side plate 220d (see FIG. 13A and FIG. 13B), and a fourth side plate 220e (see FIG. 13A, FIG. 13B, and FIG. 14B). The first side plate 220b and the second side plate 220c are parallel or approximately parallel to each other. The first side plate 220b and the second side plate 220c extend in both the longitudinal direction L and the axis direction S. The third side plate 220d and the fourth side plate 220e are parallel or approximately parallel to each other. The third side plate 220d and the fourth side plate 220e extend in both the longitudinal direction L and the orthogonal direction T.

The third side plate 220d and the fourth side plate 220e of the second support member 220 have at least portions, provided with the second engaging portions 232 and 232, elastically deformable in the axis direction S.

The first side plate 220b and the second side plate 220c of the second support member 220 are provided with support portions 243 to 243 and 244 to 244 and openings 253 to 253 and 254 to 254 (see FIG. 3, FIG. 6A, FIG. 6B, FIG. 13A, and FIG. 13B) alternately arranged in the longitudinal direction L.

The support portions 241 to 241, provided on the first side plate 210b of the first support member 210, face the openings 252 to 252, provided on the second side plate 210c of the first support member 210. The openings 251 to 251, provided on the first side plate 210b of the first support member 210, face the support portions 242 to 242, provided on the second side plate 210c of the first support member 210.

The support portions 243 to 243, provided on the first side plate 220b of the second support member 220, face the openings 254 to 254, provided on the second side plate 220c of the second support member 220. The openings 253 to 253, provided on the first side plate 220b of the second support member 220, face the support portions 244 to 244, provided on the second side plate 220c of the second support member 220.

More specifically, the opening 251 is open (in communication with the outside) on the end portion of the first side plate 210b of the first support member 210 on the side of the second support member 220. The opening 253 is open (in communication with the outside) on the end portion of the first side plate 220b of the second support member 220 on a side of the first support member 210. Thus, the opening portion 201a includes: the opening 251 on the end portion of the first side plate 210b of the first support member 210 on the side of the second support member 220; and the opening 253 on the end portion of the first side plate 220b of the second support member 220 on the side of the first support member 210.

The support portion 242 on the end portion of the second side plate 210c of the first support member 210 on a side of the second support member 220 faces the second support member 220. The support portion 244 on the end portion of the second side plate 220c of the second support member 220 on a side of the first support member 210 is at a position facing the first support member 210. Thus, the covering portion 202a includes; the support portion 242 on the end portion of the second side plate 210c of the first support member 210 on the side of the second support member 220; and the support portion 244 on the end portion of the second side plate 220c of the second support member 220 on the side of the first support member 210.

To prevent erroneous attachment such as a coupling direction of the first support member 210 and the second support member 220, the first engaging portions 231 and 231 and the second engaging portions 232 and 232 may be designed in such a manner that the diameter of each of the engaging portion having the ring shape and of the engaging portion having the cylindrical shape is different between the one side and the other side in the axis direction S. In the first embodiment, marks MK and MK (arrow marks in this example) are respectively provided to the support portion 242 (see FIG. 10A) and the support portion 244 (see FIG. 13A) at end portions of the first support member 210 and the second support member 220 on sides of the junction 230. The marks MK and MK are provided while being shifted from the center in the axis direction S on one side and their positions match in the axis direction S (are positioned on a virtual straight line along the longitudinal direction L). In this example, the marks MK and MK are formed of a material such a resin, and are integrally formed with the first support member 210 and the second support member 220.

The opening 252 on a side of the second side plate 210c of the first support member 210 opposite to the second support member 220 is open (in communication with the outside) on a side opposite to the second support member 220. The opening 254 on a side of the second side plate 220c of the second support member 220 opposite to the first support member 210 is open (in communication with the outside) on a side opposite to the first support member 210. Thus, not only the opening portion 201a in the adjacent portions 211 and 221 of the first support member 210 and the second support member 220 adjacent to each other, but also the opening portion 203a (see FIG. 3, FIG. 10A, and FIG. 13A) is opened so that the wiring member C is exposed therethrough. The opening portion 203a is provided on a predetermined bent side adjacent portion area 203 (see FIG. 3, FIG. 10A, and FIG. 13A) of at least one (one or both) of the adjacent portion 212 (see FIG. 3) of the first support member 210 adjacent to the image forming apparatus main body 110 and the adjacent portion 222 (see FIG. 3) of the second support member 220 adjacent to the movable member 130. The opening portion 203a provides the same effect as the opening portion 201a in the adjacent portions 211 and 221 of the first support member 210 and the second support member 220.

The support portion 241 at an end portion of the first side plate 210b of the first support member 210 opposite to the second support member 220 faces the image forming apparatus main body 110. The support portion 243 at an end portion of the first side plate 220b of the second support member 220 opposite to the first support member 210 faces the movable member 130. Thus, not only the covering portion 202a in the adjacent portions 211 and 221 of the first support member 210 and the second support member 220, but also a covering portion 204a (see FIG. 10B and FIG. 13B) is covered so that the wiring member C is unexposed when the first support member 210 and the second support member 220 are open.

The covering portion 204a is provided in a predetermined opposite side adjacent portion area 204 (see FIG. 10B and FIG. 13B) on the opposite side of the bent side of at least one (one or both) of the adjacent portion 212 of the first support member 210 adjacent to the image forming apparatus main body 110 and the adjacent portion 222 of the second support member 220 adjacent to the movable member 130. The covering portion 204a provides the same effect as the covering portion 202a in the adjacent portions 211 and 221 of the first support member 210 and the second support member 220.

The end portion of the first support member 210 with no adjacent support member (the adjacent portion 212 adjacent to the image forming apparatus main body 110 in this example) is attached to the image forming apparatus main body 110 directly or indirectly via a support rotation shaft such as a pin and the like (directly in this example) in such a manner as to be rotatable about the main body side rotation axis α1 (see FIG. 3 and FIG. 8).

The end portion (the adjacent portion 212 adjacent to the image forming apparatus main body 110 in this example) of the first support member 210 with no adjacent support member is detachably attached to a component 111 (see FIG. 3 and FIG. 8) of the image forming apparatus main body 110 in such a manner as to be ratable about the main body side rotation axis α1.

A junction 260 (see FIG. 3 and FIG. 8) between the first support member 210 and the component 111 of the image forming apparatus main body 110 includes: a first engaging portion 261 (see FIG. 3, FIG. 8, FIG. 9, FIG. 10A, FIG. 10B, FIG. 11A, and FIG. 11B) provided to the first support member 210; and a second engaging portion 262 (see FIG. 3 and FIG. 8) provided to the component 111 of the image forming apparatus main body 110.

The first engaging portion 261 and the second engaging portion 262 are engaged with each other in such a manner as to be rotatable about the main body side rotation axis α1. The first engaging portion 261 has a cylindrical shape protruding in the axis direction S beyond both end portions of the first support member 210 in the axis direction S. The second engaging portions 262 and 262 have a cylindrical shape in which the first engaging portions 261 and 261 are inserted.

More specifically, the first engaging portion 261 has at least one (one or both) of both end portions (the end portion on the back surface side in this example) in the axis direction S of the first support member 210 formed as a D shaped protruding part obtained by cutting the cylinder protruding in the axis direction S to be in a D shape. The second engaging portions 262, 262 on a side the where the first engaging portion 261 with the D shaped protruding part is inserted in the axis direction S have a C shape defined by a circular hole that is partially discontinuous in the circumference direction. Thus, the first support member 210 can be attached/detached to and from the image forming apparatus main body 110 while being at a predetermined angle (for example, an angle to be in parallel with the vertical line), and can be rotated about the main body side rotation axis α1 with respect to the image forming apparatus main body 110 to be at an angle other than the predetermined angle.

Thus, the predetermined angle is an angle with which the first support member 210 can be attached/detached to and from the image forming apparatus main body 110, and angles other than the predetermined angle is a swing angles of the first support member 210 relative to the image forming apparatus main body 110.

In this example, the first engaging portions 231 and 231, the second engaging portions 232 and 232, and the component 111 are made of a material such as resin. The first support member 210 and the first engaging portion 231 are integrally formed, and the component 111 and the second engaging portion 232 are integrally formed.

The end portion (the adjacent portion 222 adjacent to the movable member 130 in this example) of the second support member 220 with no adjacent support member is attached to the movable member 130 directly or indirectly via a support rotation shaft such as a pin (indirectly via the support rotation shaft P (see FIG. 3) in this example) in such a manner as to be rotatable about the movable member side rotation axis α2 (see FIG. 3).

More specifically, the end portion (the adjacent portion 222 adjacent to the movable member 130 in this example) of the second support member 220 with no adjacent support member is detachably attached to a component 131 (see FIG. 3) of the movable member 130 in such a manner as to be rotatable about the movable member side rotation axis α2.

The junction 270 (see FIG. 3) between the second support member 220 and the component 131 of the movable member 130 includes: a first engaging portion 271 (see FIG. 3, FIG. 12, FIG. 13A, FIG. 13B, FIG. 14A, and FIG. 14B) provided to the second support member 220; and a second engaging portion 272 (see FIG. 3) provided to the component 131 of the movable member 130.

The first engaging portion 271 and the second engaging portion 272 are engaged in such a manner as to be rotatable about the movable member side rotation axis α2. The first engaging portion 271 has a first through hole 271a (see FIG. 3, FIG. 12, and FIG. 14B) formed through the axis direction S. Similarly, the second engaging portion 272 includes a second through hole 272a (see FIG. 3) formed through the axis direction S. The support rotation shaft P is inserted in the first through hole 271a of the first engaging portion 271 and the second through hole 272a of the second engaging portion 272 while being aligned to each other. Thus, the first engaging portion 271 is coupled to the second engaging portion 272 in such a manner as to be rotatable about the movable member side rotation axis α2.

Thus, the second support member 220 can be attached to and detached from the movable member 130, by inserting or removing the support rotation shaft P into and out of the first through hole 271a and the second through hole 272a. The second support member 220 can be rotated about the movable member side rotation axis α2 while the support rotation shaft P is inserted in the first through hole 271a and the second through hole 272a In this example, the second engaging portions 272 are provided in a pair, and are disposed on both sides of the first engaging portion 271 in the axis direction S. The first engaging portion 271, the second engaging portions 272 and 272, and the component 131 are made of a material such as resin. The second support member 220 and the first engaging portion 271 are integrally formed. The component 131 and the second engaging portions 272 and 272 are integrally formed.

Figure 15A:
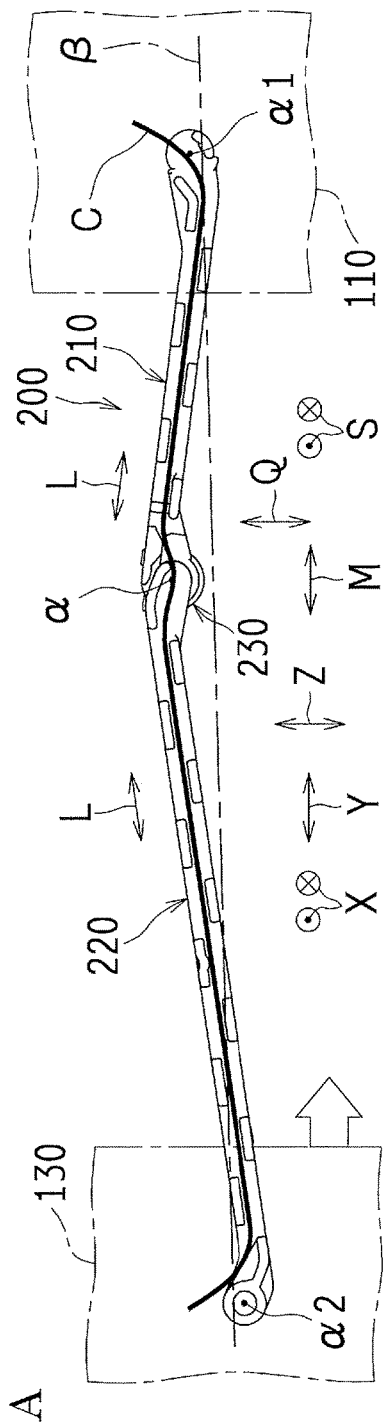
FIG. 15A is a cross-sectional view illustrating postures of the first support member and the second support member that are adjacent to each other and are open/closed as viewed from the back surface side, and illustrates a state where the first support member and the second support member, with different lengths in the longitudinal direction, are open.
Figure 15B:
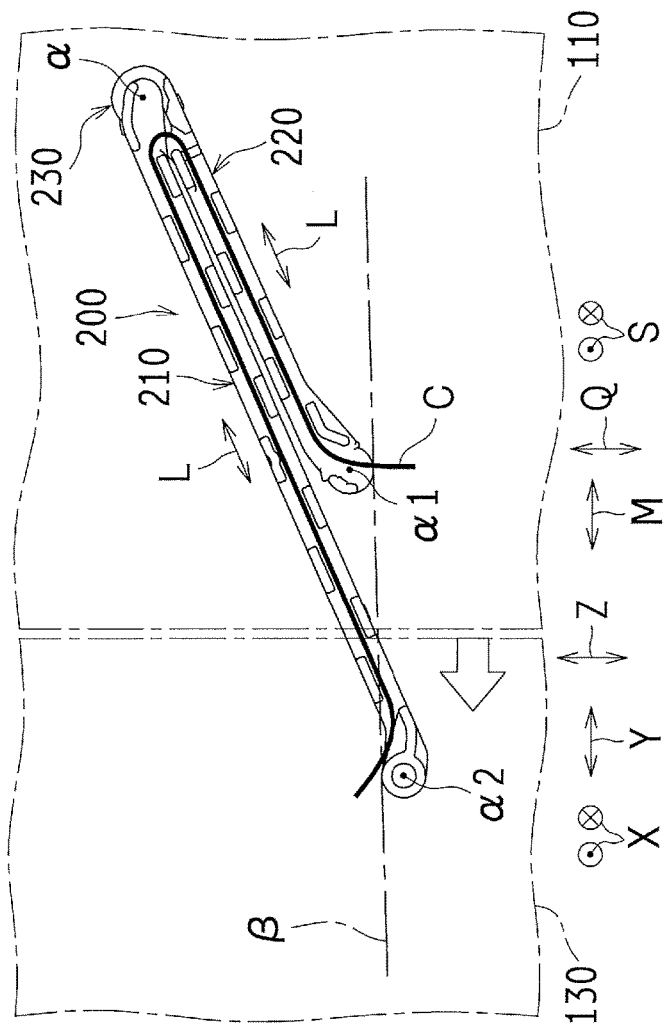
FIG. 15B is a cross-sectional view illustrating the postures of the first support member and the second support member that are adjacent to each other and are open/closed as viewed from the back surface side, and illustrates an example where the first support member and the second support member illustrated in FIG. 15A in the closed state point in an oblique direction.

FIG. 15A, FIG. 15B, FIG. 16A, and FIG. 16B are each a cross-sectional view illustrating postures of the first support member 210 and the second support member 220 that are adjacent to each other and are open/closed as viewed from the back surface side. FIG. 15A illustrates a state where the first support member 210 and the second support member 220, with different lengths in the longitudinal direction L, are open. FIG. 15B illustrates an example where the first support member 210 and the second support member 220 illustrated in FIG. 15A in the closed state point in an oblique direction. FIG. 16A illustrates a state where the first support member 210 and the second support member 220, with approximately the same length in the longitudinal direction L, are open. FIG. 16B illustrates an example where the first support member 210 and the second support member 220 illustrated in FIG. 16A in the closed state point in a linear direction Q.

In a configuration where the junction 230 moves in a direction other than the linear direction Q when the two adjacent support members (the first support member 210 and the second support member 220 in this example) are opened/closed (see FIG. 15A and FIG. 15B), an opening/closing space used for opening/closing the two support members is large. The linear direction Q is a direction orthogonal to or approximately orthogonal to both the movement direction M of the movable member 130 and the axis direction S.

In an exemplary configuration where the junction 230 moves in a direction other than the linear direction Q, for example, when the plurality of support members are two support members (the first support member 210 and the second support member 220 in this example) and the main body side rotation axis α1 and the movable member side rotation axis α2 are positioned or approximately positioned on the virtual straight line β along the movement direction M of the movable member 130 relative to the image forming apparatus main body 110, the two support members have different lengths in the longitudinal direction L. Thus, the two support members in the closed state points in the oblique direction (see FIG. 15B) or is in approximately parallel with respect to the movement direction M of the movable member 130. Thus, a large opening/closing space is required for opening/closing the two adjacent support members.

In view of the above, in the first embodiment, the junction 230 moves in the linear direction Q (see FIG. 16A and FIG. 16B) when the two adjacent support members (the first support member 210 and the second support member 220 in this example) are opened/closed. In other words, the trajectory of the movement of the junction 230 caused by the opening/closing of the two adjacent support members (the first support member 210 and the second support member 220 in this example) extends in the linear direction Q.

An example of the configuration in which the junction 230 moves in the linear direction Q when the two adjacent support members (the first support member 210 and the second support member 220 in this example) is opened/closed is as follows. Specifically, when the two support members as the plurality of support members are closed, the two support members are orthogonal to or approximately orthogonal to both the movement direction M and the axis direction S of the movable member 130. The end portion (the adjacent portion 212 adjacent to the image forming apparatus main body 110) of the support member on one end (the first support member 210 in this example) with no adjacent support member is disposed on the image forming apparatus main body 110. The end portion (the adjacent portion 222 adjacent to the movable member 130) of the support member on the other end (second support member 220 in this example) with no adjacent support member is disposed on the movable member 130. For example, in this configuration, when the main body side rotation axis α1 and the movable member side rotation axis α2 are positioned or approximately positioned on the virtual straight line β along the movement direction M of the movable member 130 relative to the image forming apparatus main body 110, the two support members have the same or approximately the same length in the longitudinal direction L.

When the movable member 130 can move back and forth relative to the image forming apparatus main body 110 in the slide direction (a horizontal direction or an approximately horizontal direction in this example), as in the first embodiment, the linear direction Q is orthogonal to or approximately orthogonal to the slide direction (a vertical or an approximately vertical direction in this example). However, this should not be construed in a limiting sense. For example, when the movable member 130 is swingable relative to the image forming apparatus main body 110 about a swing axis α long the rotation axis α, the linear direction Q includes a normal or approximately normal direction of an arch representing the trajectory of swinging of the movable member 130 about the swing axis.

Second Embodiment

Figure 17A:
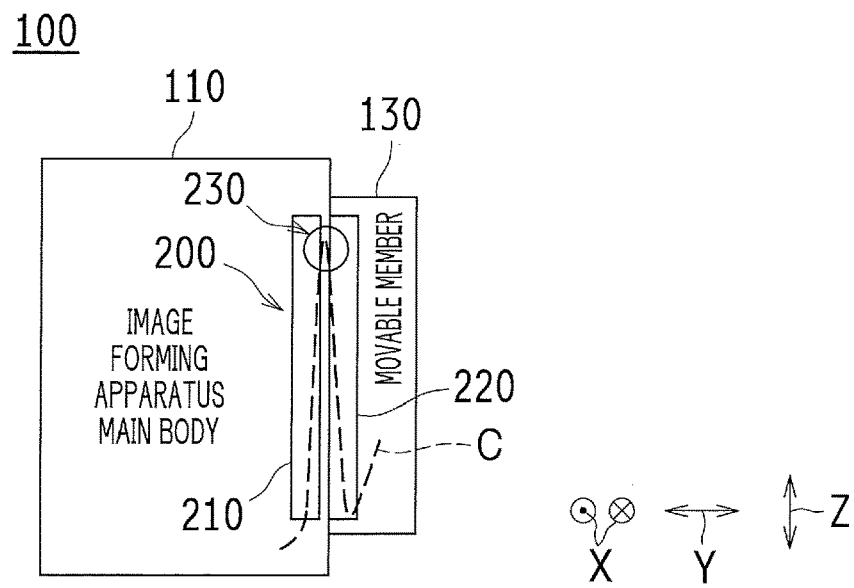
FIG. 17A is a schematic view schematically illustrating a state of the support member connection mechanism as a result of moving the movable member relative to the image forming apparatus main body, and illustrates a state of the support member connection mechanism when the movable member is attached to the image forming apparatus main body.
Figure 17B:
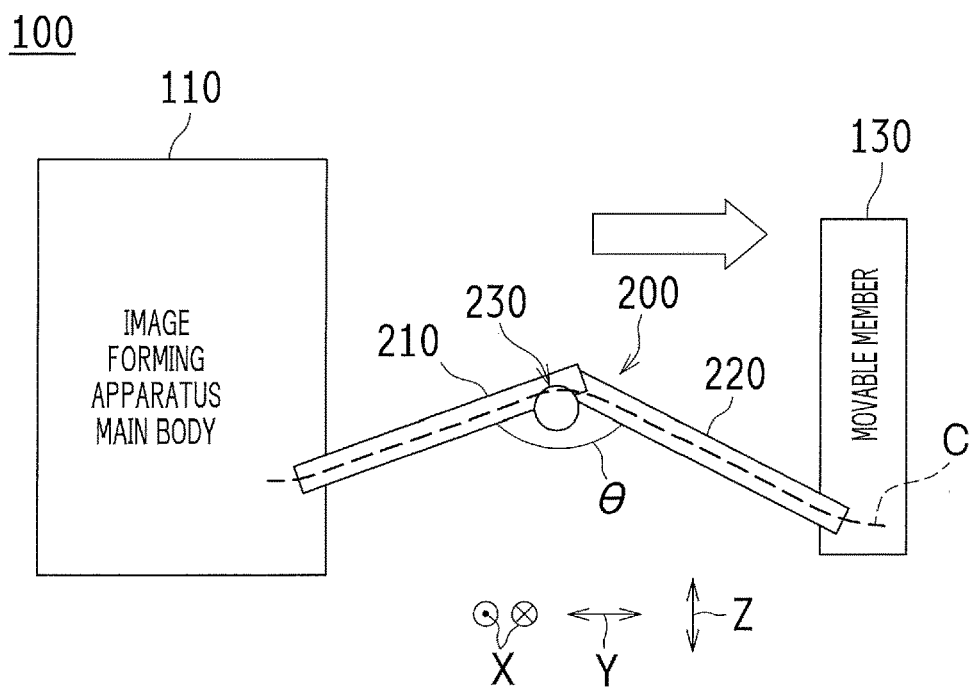
FIG. 17B is a schematic view schematically illustrating a state of the support member connection mechanism as a result of moving the movable member relative to the image forming apparatus main body, and illustrates a state of the support member connection mechanism when the movable member is separated from the image forming apparatus main body.

FIG. 17A and FIG. 17B are schematic diagrams schematically illustrating states of the support member connection mechanism 200 as a result of moving the movable member 130 relative to the image forming apparatus main body 110. FIG. 17A illustrates a state of the support member connection mechanism 200 when the movable member 130 is attached to the image forming apparatus main body 110. FIG. 17B illustrates a state of the support member connection mechanism 200 when the movable member 130 is separated from the image forming apparatus main body 110.

When the movable member 130 is attached to the image forming apparatus main body 110 (see FIG. 17A), the two adjacent support members (the first support member 210 and the second support member 220 in this example) are closed. The two support members that have been opened by a predetermined angle θ (see FIG. 17B) or more cannot be smoothly closed. For example, the two adjacent support members that are opened by 180° cannot be closed. The two support members opened by an angle exceeding 180° are closed in the opposite direction, thus are more likely to involve the problems that the support member connection mechanism 200 may be damaged.

Figure 18:
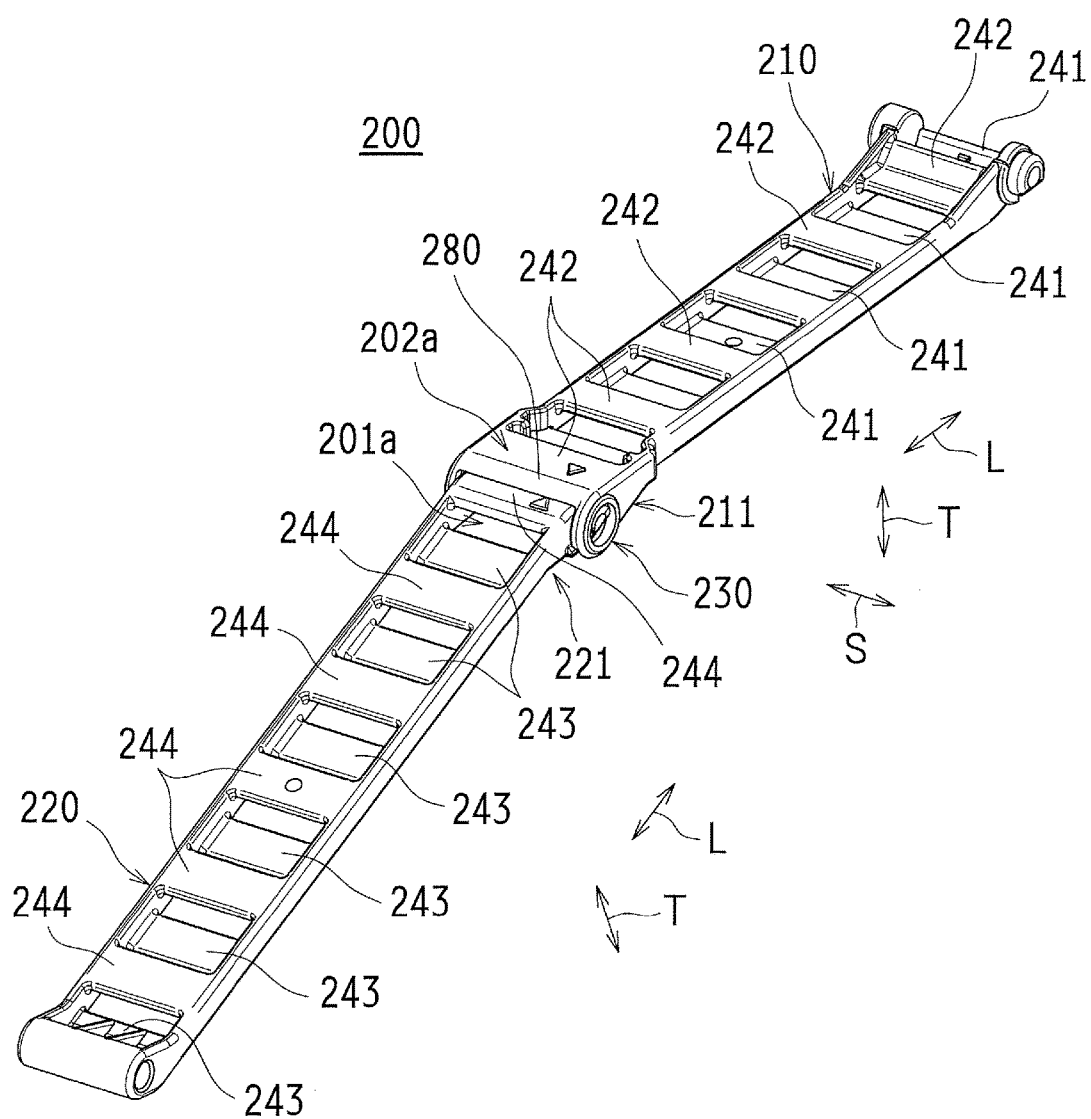
FIG. 18 is a perspective view illustrating a state of the support member connection mechanism according to a second embodiment provided with a regulating member.

FIG. 18 is a perspective view illustrating a state of the support member connection mechanism 200 according to the second embodiment provided with a regulating member 280.

In the second embodiment, configurations that are approximately the same as the first embodiment are denoted with the same reference numerals, and the description thereof is omitted.

In view of the above, the support member connection mechanism 200 according to the second embodiment further includes the regulating member 280. The regulating member 280 prevents the two adjacent support members (the first support member 210 and the second support member 220 in this example) from being opened by a predetermined angle θ (for example, 180°) or more. The regulating member 280 that prevents the two adjacent support members from being opened by a predetermined angle θ (for example, 180°) or more is provided to at least one (one or both) (the first support member 210 in this example) of the two adjacent support members in the support member connection mechanism 200.

More specifically, when the two adjacent support members (the first support member 210 and the second support member 220 in this example) are open, the one of the adjacent portions 211 and 221 (the adjacent portion 211 of the first support member 210 in this example) comes into contact with and covers the other one (the adjacent portion 221 of the second support member 220 in this example).

When the two adjacent support members (the first support member 210 and the second support member 220 in this example) are opened, the regulating member 280 comes into contact with the adjacent portion (the adjacent portion 221 of the second support member 220 in this example) of the other support member so that the one support member becomes unable to rotate.

The one adjacent portion 211 is the support portion 242 at an end portion of the one support member (the first support member 210 in this example) on a side of the other support member (the second support member 220 in this example). The other adjacent portion 221 is the support portion 244 at an end portion of the other support member (the second support member 220 in this example) on a side of the one support member (the first support member 210 in this example). The regulating member 280 is provided to the support portion 242 at the end portion of the one support member (the first support member 210 in this example). In this example, the regulating member 280 is made of a material such as resin and is integrally formed with the support portion 242.

In the support member connection mechanism 200 having the configuration described above, when the two adjacent support members (the first support member 210 and the second support member 220 in this example) are opened at an angle smaller than the predetermined angle θ (for example, 180°), the regulating member 280 (the support portion 242 at the end portion of the first support member 210 on a side of the second support member 220 in this example) comes into contact with the counterpart support member (the support portion 244 at the end portion of the second support member 220 on a side of the first support member 210 in this example). Thus, the two support members can be prevented from being opened by the predetermined angle θ (for example, 180°) or more.

Third Embodiment

FIG. 19, FIG. 20A, FIG. 20B, FIG. 21A, and FIG. 21B are each a perspective view illustrating a state of the support member connection mechanism 200 according to a third embodiment provided with return members 290 and 290.

Figure 19:
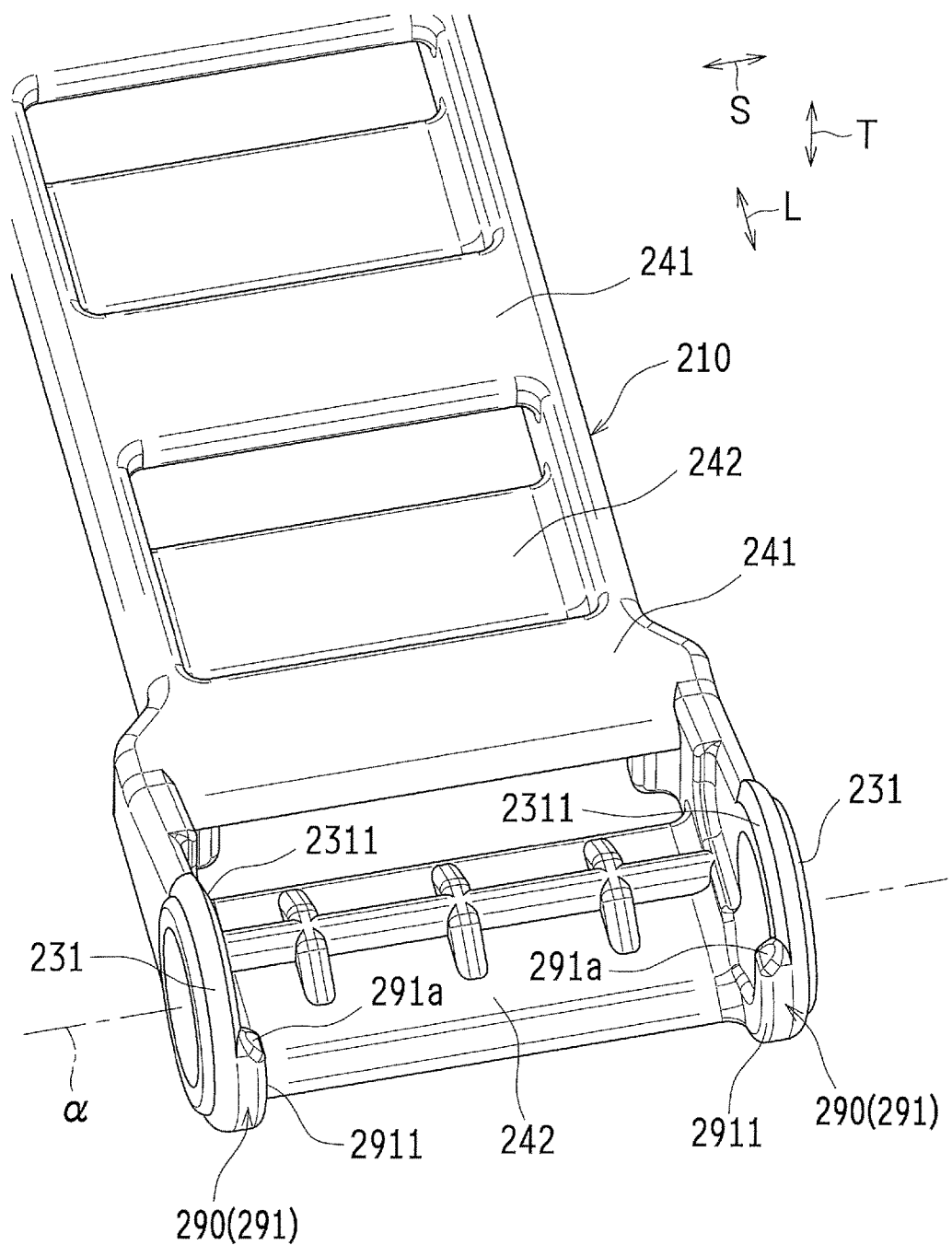
FIG. 19 is a perspective view illustrating a state of the support member connection mechanism according to a third embodiment provided with return members, and is an enlarged view illustrating the return member on a front surface side and the return member on a back surface side in the first support member.
Figure 20A:
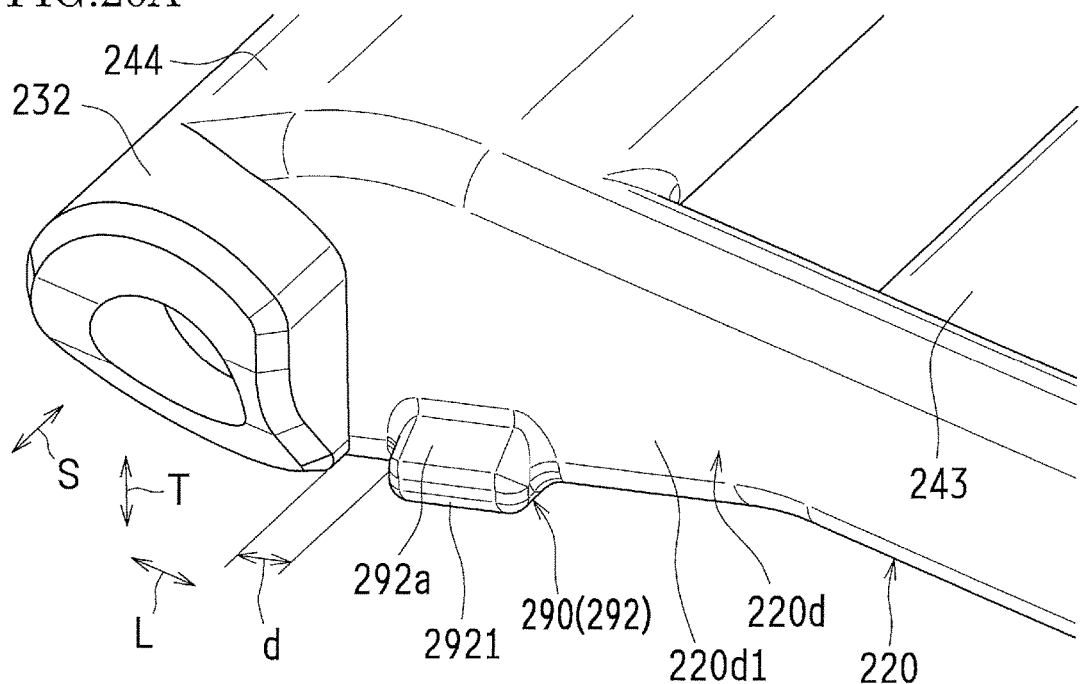
FIG. 20A is a perspective view illustrating a state of the support member connection mechanism according to the third embodiment provided with the return members, and is an enlarged view illustrating the return member on the front surface side in the second support member.
Figure 20B:
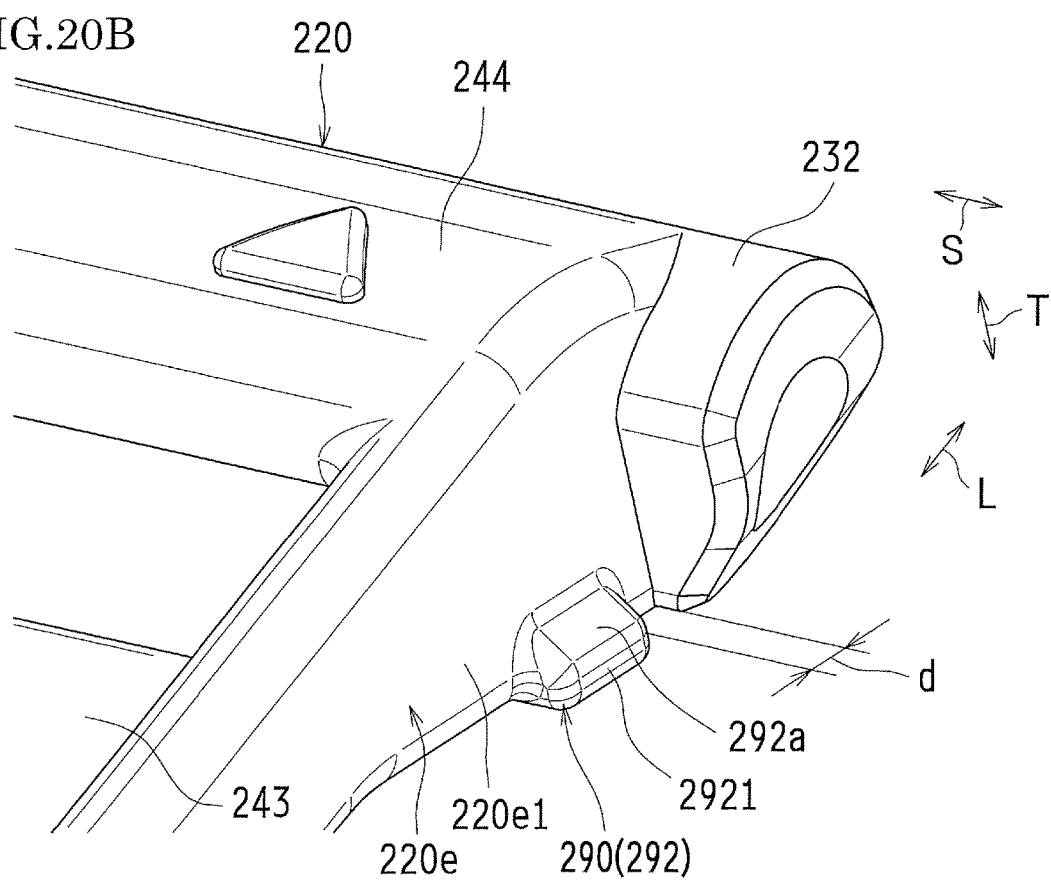
FIG. 20B is a perspective view illustrating a state of the support member connection mechanism according to the third embodiment provided with the return members, and is an enlarged view illustrating the return member on the back surface side.
Figure 21A:
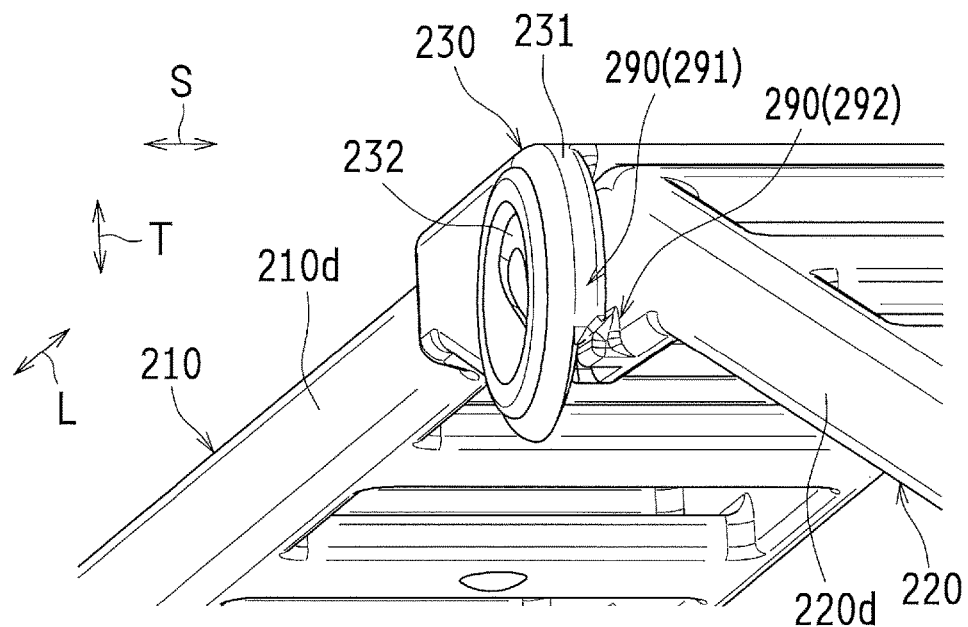
FIG. 21A is a perspective view illustrating a state of the support member connection mechanism according to the third embodiment provided with the return members, and is an enlarged view illustrating a state of the return member on the front surface side, when the first support member and the second support member, coupled to each other via a junction, are opened by a predetermined angle or more.
Figure 21B:
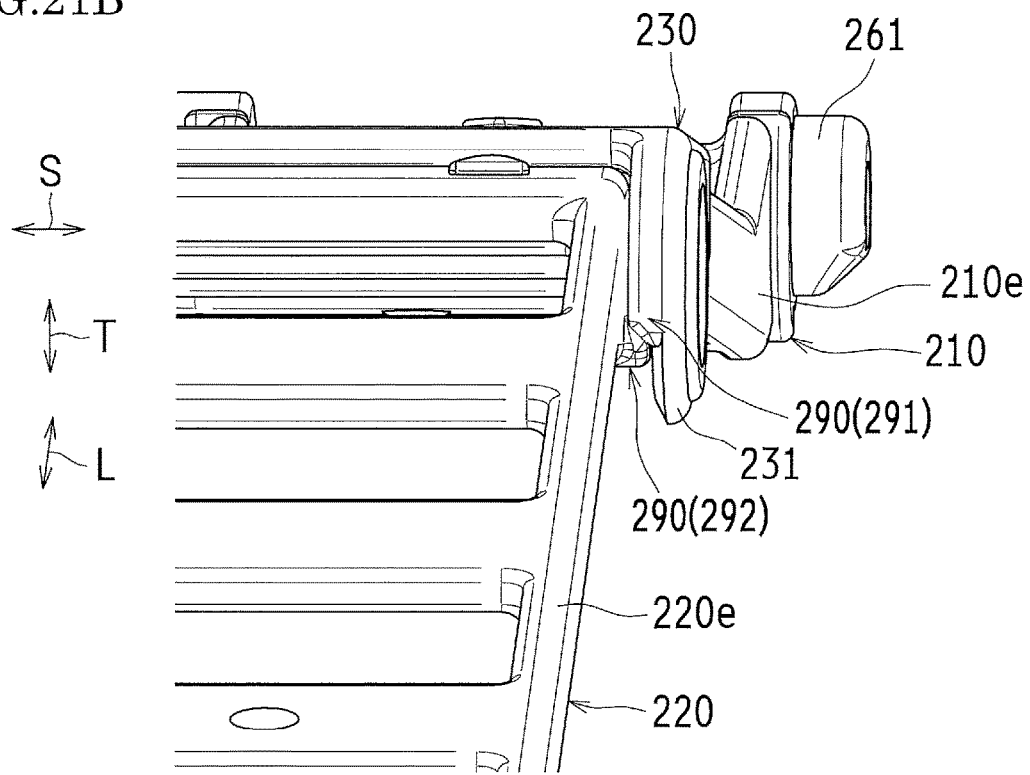
FIG. 21B is a perspective view illustrating a state of the support member connection mechanism according to the third embodiment provided with the return members, and is an enlarged view illustrating a state of the return member on the back surface side.

FIG. 19 is an enlarged view illustrating the return member 290 (291) on the front surface side and the return member 290 (291) on the back surface side in the first support member 210. FIG. 20A and FIG. 20B are each an enlarged view illustrating the return member 290 (292) on the front surface side and the return member 290 (292) on the back surface side in the second support member 220. FIG. 21A and FIG. 21B are each an enlarged view illustrating a state of the return member 290 (291, 292) on the front surface side and the return member 290 (291, 292) on the back surface side, when the first support member 210 and second support member 220, coupled to each other via the junction 230, are opened by a predetermined angle θ or more.

In the third embodiment, configurations that are approximately the same as the first embodiment are denoted with the same reference numerals, and the description thereof is omitted.

The support member connection mechanism 200 according to the third embodiment further includes the return members 290 (291, 292) that return an angle between the two adjacent support members (the first support member 210 and the second support member 220 in this example) to a smaller angle than the predetermined angle θ (for example,) 180° even if the two adjacent support members are opened by the predetermined angle θ or more.

The return members 290 include: the first return member 291 (see FIG. 19) provided to the first support member 210; and the second return member 292 (see FIG. 20A and FIG. 20B) provided to the second support member 220. The first return member 291 and the second return member 292 come into contact with each other when the first support member 210 and the second support member 220 are opened by the predetermined angle θ (for example, 180°) or more, so that the first support member 210 and the second support member 220 return to a state of having an angle smaller than the predetermined angle θ therebetween.

The first return member 291 is a protruding portion that extends to be in an ark-like shape about the rotation axis α and protrudes inward in the axis direction S. The second return member 292 is a projection portion that protrudes outward in the axis direction S on a movement trajectory of the first return member 291.

More specifically, the first return members 291 are disposed on the inner sides of the first engaging portions 231 and 231 of the junction 230 provided to the first support member 210, in the axis direction S. The second return members 292 are provided to both end portions (more specifically, the third side plate 220d and the fourth side plate 220e) of the second support member 220. The second return members 292 and 292 are disposed on a side of the second engaging portions 232 and 232, forming the junction 230 in the second support member 220, opposite to the first support member 210, while being separated from the second engaging portions 232 and 232 by predetermined distances d and d (see FIG. 20A and FIG. 20B).

In this example, the first return members 291 and 291 include inclined surfaces 291a and 291a (see FIG. 19) at end portions on sides to be in contact with the second return members 292 and 292. The inclined surfaces 291a and 291a are inclined to be thicker as they get closer to the top surfaces 2911 and 2911 (see FIG. 19) from the inner side surfaces 2311 and 2311 (see FIG. 19) of the first engaging portions 231 and 231. The second return members 292 and 292 includes inclined surfaces 292a and 292a (see FIG. 20A and FIG. 20B) at end portions on sides to be in contact with the first return members 291 and 291. The inclined surfaces 292a and 292a are inclined to be thicker as they get closer to the top surfaces 2921 and 2921 (see FIG. 20A and FIG. 20B) from the outer surface 220d1 (see FIG. 20A) of the third side plate 220d and the outer surface 220e1 (see FIG. 20B) of the fourth side plate 220e.

In this example, the return members 290 are formed of a material such as resin. The first return members 291 and 291 are integrally formed with the first engaging portions 231 and 231. The second return members 292 and 292 are integrally formed with the second support member 220 and 220.

In the support member connection mechanism 200 having the configuration described above, when the user performs an operation of separating the movable member 130 from the image forming apparatus main body 110 so that the first support member 210 and the second support member 220 are opened by the predetermined angle θ (for example, 180°), the first return members 291 and 291 provided to the first engaging portions 231 and 231 come into contact with the second return members 292 and 292 provided to the first support member 210 (see FIG. 21A and FIG. 21B). When the first support member 210 and the second support member 220 are further opened to be at an angle exceeding the predetermined angle θ, the first return members 291 and 291 move on to the second return members 292 and 292 (in this example, the inclined surfaces 292a and 292a are provided so that the first return members 291 and 291 smoothly climb move on to the second return members 292 and 292 along the inclined surfaces 292a and 292a). Thus, the first engaging portions 231 and 231 provided to both end portions of the first support member 210 in the axis direction S are pushed in the axis direction S to be expanded, and thus the first support member 210 elastically deform. When the user stops the operation of separating the movable member 130 from the image forming apparatus main body 110 in this state, the elastic force from the first support member 210 restoring from the elastically deformed state causes the first return members 291 and 291 to slip off from the second return members 292 and 292 (in this example, the inclined surfaces 292a and 292a are provided so that the first return members 291 and 291 smoothly slip off from the second return members 292 and 292 along the inclined surfaces 292a and 292a). Thus, the first support member 210 and the second support member 220 pivot in a closing direction, whereby the first support member 210 and the second support member 220 return to a state of having an angle smaller than the predetermined angle θ therebetween.

The return members 290, which are the first return member 291 as the protruding portion and the second return member 292 as the projecting portion in this example, may have any other configuration provided that when the first support member 210 and the second support member 220 are opened by the predetermined angle θ or more the first support member 210 and the second support member 220 can be returned to a state of having an angle smaller than the predetermined angle θ therebetween. For example, the return member 290 may be a restoring force delivery unit that delivers no restoring force to the first support member 210 and the second support member 220 in a state of having an angle smaller than the predetermined angle θ therebetween, and delivers the restoring force for pressing, in the returning direction, the first support member 210 and the second support member 220 when the first support member 210 and the second support member 220 are opened by the predetermined angle θ or more. An example of the restoring force delivery unit includes a structure including: a first engagement portion that engages with the first support member 210 in a closing direction; a second engagement portion that engages with the second support member 220 in a closing direction; and a torsion coil spring (what is known as a kick spring). The torsion coil spring is connected to the first engagement portion and the second engagement portion, and includes a coil spring portion that delivers the restoring force to push, in the returning direction, the first support member 210 and the second support member 220 when the first support member 210 and the second support member 220 are opened by the predetermined angle θ or more.

Fourth Embodiment

Figure 22A:
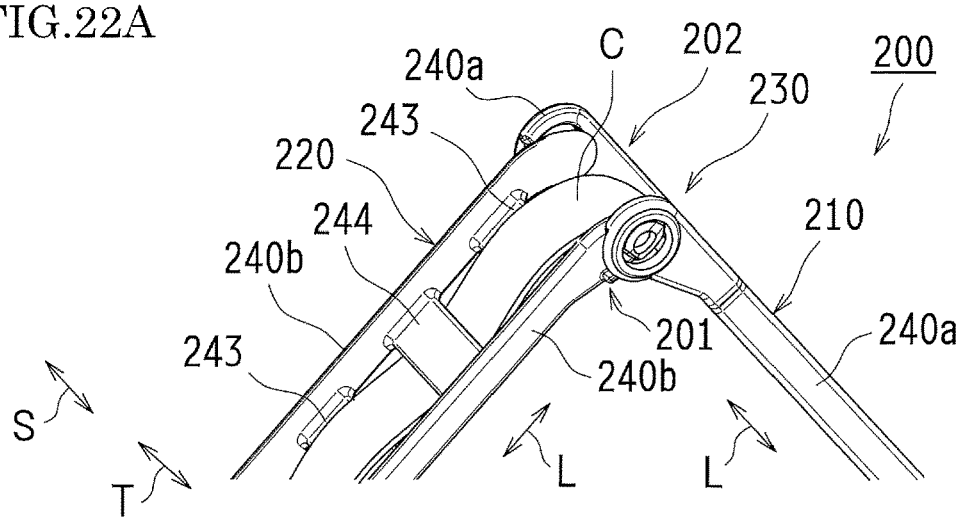
FIG. 22A is a diagram illustrating a part of the first support member and the second support member in the support member connection mechanism according to a fourth embodiment, and is a schematic perspective view illustrating an area of the junction in a state where the first support member and the second support member are open.
Figure 22B:
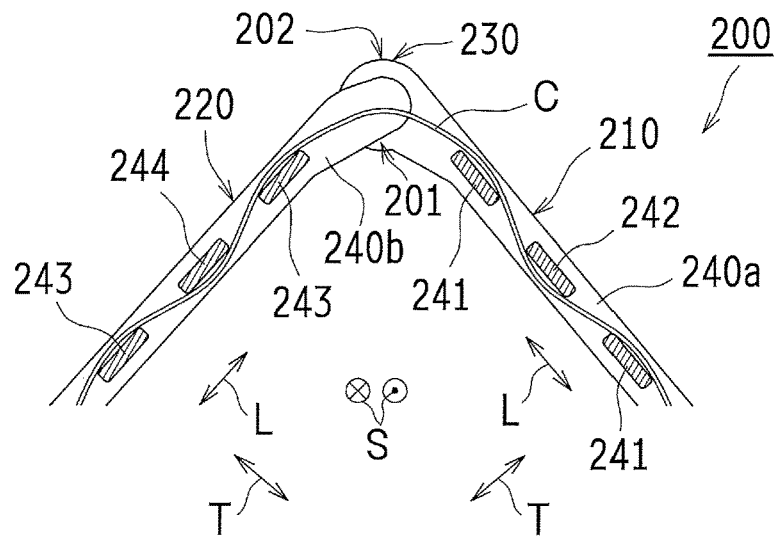
FIG. 22B is a diagram illustrating a part of the first support member and the second support member in the support member connection mechanism according to the fourth embodiment, and is a schematic cross-sectional view illustrating the area of the junction in the state where the first support member and the second support member are open.
Figure 22C:
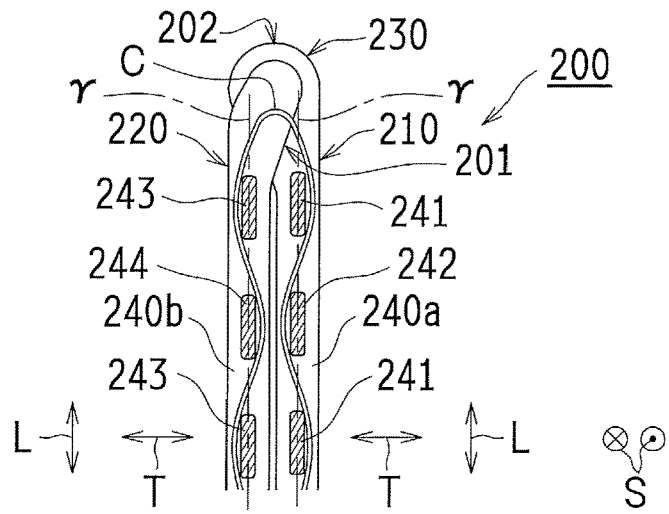
FIG. 22C is a diagram illustrating a part of the first support member and the second support member in the support member connection mechanism according to the fourth embodiment, and is a schematic cross-sectional view illustrating the area of the junction in a state where the first support member and the second support member are closed.
Figure 23A:
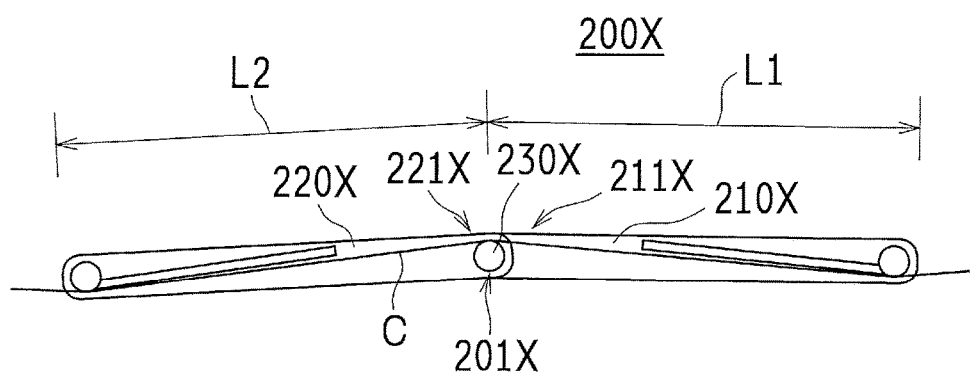
FIG. 23A is a schematic cross-sectional view illustrating a state of a wiring member as a result of opening/closing two adjacent support members in a conventional support member connection mechanism, and illustrates an example where the wiring member is not slacked when the two adjacent support members are open.
Figure 23B:
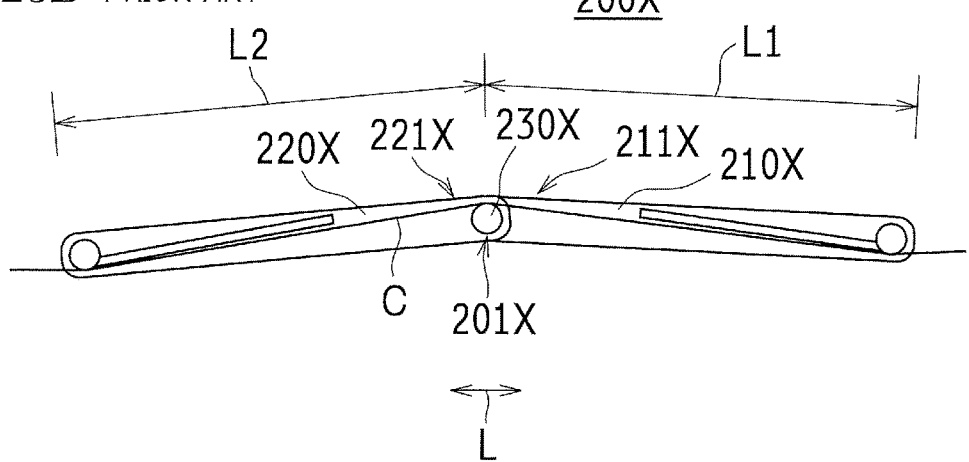
FIG. 23B is a schematic cross-sectional view illustrating a state of the wiring member as a result of opening/closing the two adjacent support members in a conventional support member connection mechanism, and illustrates a state where the two adjacent support members, in the example illustrated in FIG. 23A, are closed.
Figure 24A:
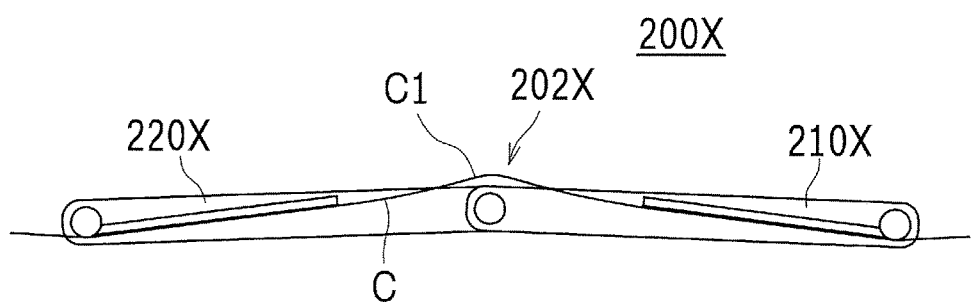
FIG. 24A is a schematic cross-sectional view illustrating a state of the wiring member as a result of opening/closing two adjacent support members in the conventional support member connection mechanism, and illustrates an example where the wiring member is slacked when the two adjacent support members are open.
Figure 24B:
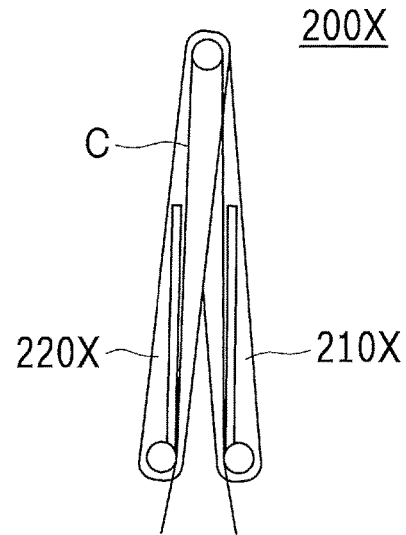
FIG. 24B is a schematic cross-sectional view illustrating a state of the wiring member as a result of opening/closing the two adjacent support members in the conventional support member connection mechanism, and illustrates a state where the two adjacent support members, in the example illustrated in FIG. 24A, are closed.

FIG. 22A, FIG. 22B, and FIG. 22C are each a diagram illustrating a part of the first support member 210 and the second support member 220 in the support member connection mechanism 200 according to a fourth embodiment. FIG. 22A is a schematic perspective view illustrating an area of the junction 230 in a state where the first support member 210 and the second support member 220 are open. FIG. 22B is a schematic cross-sectional view illustrating the area of the junction 230 in the state where the first support member 210 and the second support member 220 are open. FIG. 22C is a schematic cross-sectional view illustrating the area of the junction 230 in a state where the first support member 210 and the second support member 220 are closed. In the configuration illustrated in FIG. 22A, FIG. 22B, and FIG. 22C, the covering portion 202a is not provided to the opposite side junction area 202, and thus the wiring member C is exposed from both the bent side junction area 201 and the opposite side junction area 202.

In the fourth embodiment, configurations that are approximately the same as the first embodiment are denoted with the same reference numerals, and the description thereof is omitted.

In the support member connection mechanism 200 according to the fourth embodiment, the plurality of support members (the first support member 210 and the second support member 220 in this example) include support portions 241, 242, . . . , 243, 244, . . . (see FIG. 22A, FIG. 22B, and FIG. 22C). The support portions 241, 242, . . . , 243, 244, . . . are arranged on a single or approximately single line γ and γ (see FIG. 22C) at a predetermined position (the center portion in this example) in the orthogonal direction T (more specifically, the thickness direction) orthogonal or approximately orthogonal to both the axis direction S and the longitudinal direction L, and are arranged at an interval (a predetermined interval in this example) along the longitudinal direction L. The wiring member C is arranged alternately on one side surface of one of the adjacent support portions (241, 242), (243, 244) of the support portions 241, 242, . . . , 243, 244, . . . in the orthogonal direction T (more specifically, the thickness direction) and then on the other side surface of the other one of the adjacent support portions (241, 242), (243, 244).

More specifically, the first support member 210 includes a pair of side plates 240a and 240a. The pair of side plates 240a and 240a extend in the longitudinal direction L, and face each other in a direction that is orthogonal to both the longitudinal direction L and the orthogonal direction T (which is the axis direction S) while being apart from each other in the axis direction S by a predetermined distance. Between the pair of side plates 240a and 240a, the plurality of support portions 241, 242, . . . (more specifically, the support plates) are arranged side by side in both the longitudinal direction L and the axis direction S at a predetermined interval along the longitudinal direction L. Similarly, the second support member 220 includes a pair of side plates 240b and 240b. The pair of side plates 240b and 240b extend in both the longitudinal direction L and face each other in a direction that is orthogonal to both the longitudinal direction L and the orthogonal direction T (which is the axis direction S) while being apart from each other in the axis direction S by the predetermined distance. Between the pair of side plates 240b and 240b, the plurality of support portions 243, 244, . . . (more specifically, the support plates) are arranged side by side in both the longitudinal direction L and the axis direction S at a predetermined interval along the longitudinal direction L. Then, the single or approximately single line γ and γ is along the longitudinal direction L.

Other Embodiments

The plurality of support members, which are two support members in the embodiments described above, may be three or more support members.

In the present embodiment, the plurality of support members (the first support member 210 and the second support member 220 in this example) are provided with the openings 253 to 253 and 254 to 254. Alternatively, the wiring member C may have the circumference entirely or approximately entirely covered with the openings 251 to 251, 252 to 252, 253 to 253, and 254 to 254 omitted except for the openings 251 and 253 at the side end portion forming the opening portion 201a.

In the present embodiment, the opening portion 201a, formed on each of the support members (the first support member 210 and the second support member 220 in this example) adjacent to each other, may be provided on one of the support members adjacent to each other.

In the present embodiment, the covering portion 202a, provided on each of the support members (the first support member 210 and the second support member 220 in this example) adjacent to each other, may be provided on one of the support members adjacent to each other.

In the present embodiment, the first support member 210 and the second support member 220, respectively provided on the side of the image forming apparatus main body 110 and on the side of the movable member 130, may respectively be provided on the side of the movable member 130 and on the side of the image forming apparatus main body 110.

In the present embodiment, the support member connection mechanism 200 is disposed between the image forming apparatus main body 110 and the movable member 130 with the movable member 130 being capable of moving back and forth relative to the image forming apparatus main body 110 in the predetermined slide direction. Alternatively, the support member connection mechanism 200 may be disposed between the image forming apparatus main body 110 and the movable member 130 with the movable member 130 being capable of swinging back and forth relative to the image forming apparatus main body 110 about the swing axis α long the rotation axis α.

In the present embodiment, the plurality of support members (the first support member 210 and the second support member 220 in this example) are bent in such a manner that the junction 230 moves upward. The plurality of support members may be bent in any direction, and thus may be bent in such a manner that the junction 230 moves downward for example.

In the present embodiment, the plurality of support members are bent in a single direction. Alternatively, the plurality of support members may be bent alternately in one direction and another direction for example, to be alternately bent in opposite directions.

Embodiments Described Above

In the support member connection mechanism 200 described above, the wiring member C is exposed at the predetermined bent side junction area 201 including the area of the junction 230 on the bent side of the support member (the first support member 210 and the second support member 220 in this example). Thus, even if the two support members are closed in the state and the wiring member C is pulled, the portion (more specifically, the opening portion 201*a*) through which the wiring member C is exposed can allow an increase in the length of central path (L1+L2) from that when the two support members are open to that when the two support members are closed. Thus, the two adjacent support members (the first support member 210 and the second support member 220 in this example) can be closed with no hindrance. With the portion (more specifically, the opening portion 201*a*) through which the wiring member C is exposed being able to allow an increase in the length of central path (L1+L2) from that when the two support members are open to that when the two support members are closed, the wiring member C is not allowed to be slacked in the state where the two support members are open. Thus, the wiring member C can be prevented from being pushed out from the opposite side junction area 202 opposite to the bent side of the two support members in the open state. All things considered, problems such as breaking of the wiring member C can be prevented when the two support members are open.

This is particularly effective in a configuration in which the wiring member C is unmovable or approximately unmovable in the longitudinal direction L relative to the two adjacent support members (the first support member 210 and the second support member 220 in this example) when the two support members are being opened/closed.

If the wiring member C is a plurality of electric wires randomly bundled, when the two adjacent support members (the first support member 210 and the second support member 220 in this example) are closed, the electric wires on the inner side in the radial direction about the rotation axis α are more largely bent than the electric wires on the outer side due to the difference in the circumferential distance and thus are more likely to involve the problems such as breaking.

In view of the above, in the present embodiment, the plurality of support members (the first support member 210 and the second support member 220 in this example) have a size in the width direction (the axis direction S of the rotation axis α) along the rotation axis α longer than a size in the thickness direction (orthogonal direction T) orthogonal to both the width direction and the longitudinal direction L. Thus, when the two adjacent support members (the first support member 210 and the second support member 220 in this example) are closed, the amount of bending can be the same or approximately the same among the electric wires in the wiring member C. Thus, the problems such as breaking of the wiring member C due to the difference in the circumferential distance can be effectively prevented.

In the present embodiment, the wiring member C is covered in the predetermined opposite side junction area 202 including the area of the junction 230 opposite to the bent side of the two adjacent support members (the first support member 210 and the second support member 220 in this example). Thus, the wiring member C can be effectively prevented from being pushed out from the opposite side junction area 202 when the two support members are open. Thus, the problems such as breaking of the wiring member C can be effectively prevented when the two support members are open.

In the present embodiment, the plurality of support members (the first support member 210 and the second support member 220 in this example) are provided with the plurality of support portions 241 to 244 that are arranged at an interval in the longitudinal direction L. Thus, the wiring member C can be effectively supported.

The plurality of support members (the first support member 210 and the second support member 220 in this example) may entirely or approximately entirely cover the circumference of the wiring member C. When the support members are each molded with a mold, the support members are each formed with two independent parts on one side and the other side in a direction orthogonal or approximately orthogonal to the longitudinal direction L (the orthogonal direction T orthogonal to both the axis direction S and the longitudinal direction L for example), thus have complex configuration and are more likely to involve the problems that is difficult to assemble.

In view of the above, the plurality of support members (the first support member 210 and the second support member 220 in this example) according to the embodiments described above include the support portions 241 to 244 that are alternately arranged on the one side and the other side in the direction (the orthogonal direction T in this example) orthogonal to or approximately orthogonal to the longitudinal direction L, at an interval along the longitudinal direction L. Thus, even if the support members are each molded with a mold, the support members can be individually molded with the mold on which a through hole certainly provided, and thus can be each formed as a single member. All things considered, the support members can be effectively prevented from having a complex structure and being difficult to assemble.

The plurality of support members (the first support member 210 and the second support member 220 in this example) according to the embodiments described above have one end portion (the adjacent portion 212 adjacent to the image forming apparatus main body 110 in this example) rotatably provided to the electrical apparatus main body (the image forming apparatus main body 110 in this example), and has the other end portion (the adjacent portion 222 adjacent to the movable member 130 in this example) rotatably provided to the movable member 130, and pivot in accordance with the operation of moving the movable member 130 relative to the electrical apparatus main body. Thus, for example, no connector, used in conventional cases, is used for connecting between a control board of an electrical apparatus main body and an operation member in the movable member 130. Thus, a cost reduction can be achieved, and improvement of the conductivity and durability can be achieved because the wiring member C is constantly in the connection state. When the movable member 130 moves relative to the electrical apparatus main body (the image forming apparatus main body 110 in this example), the two adjacent support members (the first support member 210 and the second support member 220 in this example) can be smoothly closed as described above. Furthermore, the problems such as breaking of the wiring member C can be prevented when the two support members are open.

In the embodiments described above, the support member connection mechanism 200 is positioned in the area β2 other than the attaching/detaching operation area β1 needed when the attachable/detachable member 150 is attached/detached. Thus, the attachable/detachable member 150 can be attached to and detached from the electrical apparatus main body (the image forming apparatus main body 110 in this example) without the support member connection mechanism 200 being in the way.

In the present embodiment, the junction 230 moves in the linear direction Q when the two adjacent support members (the first support member 210 and the second support member 220 in this example) are opened/closed (for example, the plurality of support members are two support members, and when the two support members are closed the two support members is orthogonal or approximately orthogonal to both the movement direction M and the axis direction S). Thus, the two support members require the minimum possible opening/closing space. All things considered, the support member connection mechanism 200 can be contained within the electrical apparatus without occupying a large volume when the movable member 130 is closed relative to the electrical apparatus main body (the image forming apparatus main body 110 in this example).

In the second embodiment, the regulating member 280 is further provided that prevents the two adjacent support members (the first support member 210 and the second support member 220 in this example) from being opened by the predetermined angle θ or more. Thus, the two support members can be smoothly closed, whereby the support member connection mechanism 200 can be prevented from being damaged. Specifically, the regulating member 280 prevents the two support members (the first support member 210 and the second support member 220 in this example) from being opened by 180° or more. This means that the two support members can only be opened by an angle smaller than 180°. All things considered, the problems that the two support members cannot be closed or closed in the opposite direction to damage the support member connection mechanism 200 can be prevented.

In the third embodiment, the return members 290 are further provided that return an angle between the two adjacent support members (the first support member 210 and the second support member 220 in this example) to a smaller angle than the predetermined angle θ even if the two adjacent support members are opened by the predetermined angle θ or more. Thus, the two support members can be opened by the predetermined angle θ or more. Even if the two adjacent support members are opened by the predetermined angle θ or more the two support members can be returned to a state of having an angle smaller than the predetermined angle θ therebetween. Thus, the two support members can be smoothly closed. For example, Even if the two adjacent support members (the first support member 210 and the second support member 220 in this example) are opened by 180° or more the two support members can be returned to a state of having an angle smaller than 180° therebetween. All things considered, the problems that the two support members cannot be closed or closed in the opposite direction to damage the support member connection mechanism 200 can be prevented.

In the fourth embodiment, the plurality of support members (the first support member 210 and the second support member 220 in this example) include the support portions 241, 242, . . . , 243, 244, . . . that are at a predetermined position in the orthogonal direction T (more specifically, thickness direction) orthogonal or approximately orthogonal to both the axis direction S and the longitudinal direction L, and are arranged at an interval along the longitudinal direction L, on the single or approximately single line γ and γ. Thus, the wiring member C can be alternately supported by one side surface of one of each adjacent support portions (241, 242), (243, 244) and then by the other side surface of the support portions in the orthogonal direction T (more specifically, thickness direction). Thus, the wiring member C can be certainly supported.

The present invention is not limited to the above-described embodiments and can be implemented in various other forms. These embodiments are provided by way of example and are not construed in a limited sense. The scope of the present invention is defined by the appended claims and is not restricted by the specification in any manner. Furthermore, modifications and changes belonging to the equivalents of the claims are within the scope of the present invention.

What is claimed is:

1. A support member connection mechanism comprising:
   a plurality of support members that are arranged side by side in a longitudinal direction of a wiring member and are configured to support the wiring member; and
   a junction configured to couple between two adjacent support members of the plurality of support members in such a manner that the two adjacent support members are bendable to one side about a rotation axis,
   wherein the wiring member is entirely covered so as to be unexposed in a predetermined opposite side junction area including an area of the junction on an opposite side of a bent side of the two adjacent support members, and
   wherein each of the two support members comprises an engaging portion, integrally formed with a respective support member, the engaging portions being formed to be complementarily engaged, the junction consisting of the two engaging portions being directly engaged.

2. The support member connection mechanism according to claim 1, wherein the plurality of support members have a size in a width direction along the rotation axis longer than a size in a thickness direction orthogonal to both the width direction and the longitudinal direction.

3. The support member connection mechanism according to claim 1, wherein the plurality of support members each include a plurality of support portions arranged at an interval along the longitudinal direction.

4. The support member connection mechanism according to claim 1,
   wherein the support member connection mechanism is provided in an electrical apparatus including an electrical apparatus main body and a movable member capable of moving relative to the electrical apparatus main body,
   wherein the plurality of support members have one end portion rotatably provided to the electrical apparatus main body and have another end portion rotatably provided to the movable member, and
   wherein the plurality of support members are configured to pivot in accordance with an operation of moving the movable member relative to the electrical apparatus main body.

5. The support member connection mechanism according to claim 4, wherein the electrical apparatus further includes an attachable/detachable member configured to be detachably attached to the electrical apparatus main body, and wherein the support member connection mechanism is positioned in an area other than an attaching/detaching operation area needed when the attachable/detachable member is attached/detached.

6. The support member connection mechanism according to claim 4, wherein when the two adjacent support members are opened/closed, the junction moves in a linear direction orthogonal to or approximately orthogonal to both a movement direction in which the movable member moves and an axis direction of the rotation axis.

7. The support member connection mechanism according to claim 1 further comprising a regulating member configured to prevent the two adjacent support members from being opened by a predetermined angle or more.

8. The support member connection mechanism according to claim 1 further comprising a return member configured to return an angle between the two adjacent support members to a smaller angle than a predetermined angle even if the two adjacent support members are opened by the predetermined angle or more.

9. An electrical apparatus including the support member connection mechanism according to claim 1.

10. The support member connection mechanism according to claim 1, wherein the wiring member is covered so as to be unexposed in the opposite side junction area when the two adjacent support members are opened.

11. The support member connection mechanism according to claim 1, wherein the wiring member is exposed in a predetermined bent side junction area including the area of the junction on the bent side of the two adjacent support members.

12. The support member connection mechanism according to claim 1, wherein the wiring member in the area of the junction is covered by part of the support members.

13. The support member connection member according to claim 1, wherein each of the support members includes a covering portion that is configured to cover the area of the junction on the opposite side of the bent side.

* * * * *